United States Patent
Kariya

(10) Patent No.: US 7,755,166 B2
(45) Date of Patent: Jul. 13, 2010

(54) PACKAGE SUBSTRATE WITH BUILT-IN CAPACITOR AND MANUFACTURING METHOD THEREOF

(75) Inventor: Takashi Kariya, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/401,127

(22) Filed: Mar. 10, 2009

(65) Prior Publication Data

US 2009/0175011 A1 Jul. 9, 2009

Related U.S. Application Data

(62) Division of application No. 11/341,485, filed on Jan. 30, 2006, now Pat. No. 7,525,175.

(30) Foreign Application Priority Data

Jan. 31, 2005 (JP) ............................. 2005-022992

(51) Int. Cl.
*H01L 29/00* (2006.01)
(52) U.S. Cl. ................ 257/532; 257/535; 257/E29.342
(58) Field of Classification Search ................. 257/532, 257/535, E29.342; 361/763
See application file for complete search history.

(56) References Cited

U.S. PATENT DOCUMENTS

| 5,449,948 | A | 9/1995 | Inoue et al. |
| 6,177,716 | B1 | 1/2001 | Clark |
| 6,924,562 | B2 * | 8/2005 | Kinoshita .................... 257/698 |
| 7,161,793 | B2 | 1/2007 | Kurihara et al. |
| 7,172,945 | B2 | 2/2007 | Shioga et al. |
| 7,288,459 | B2 * | 10/2007 | Guzek et al. ................. 257/532 |

(Continued)

FOREIGN PATENT DOCUMENTS

JP 06-188571 7/1994

(Continued)

OTHER PUBLICATIONS

U.S. Appl. No. 12/401,166, filed Mar. 10, 2009, Kariya.

*Primary Examiner*—W. David Coleman
*Assistant Examiner*—Sun M Kim
(74) *Attorney, Agent, or Firm*—Oblon, Spivak, McClelland, Maier & Neustadt, L.L.P.

(57) ABSTRACT

When a package substrate with a built-in capacitor includes a first thin-film small electrode 41*aa* and a second thin-film small electrode 42*aa* that are electrically short-circuited to each other via a pinhole P in a high-dielectric layer 43, a power supply post 61*a* and a via hole 61*b* are not formed in the first thin-film small electrode 41*aa*, and a ground post 62*a* and a via hole 62*b* are not formed in the second thin-film small electrode 42*aa*, either. As a result, the short-circuited small electrodes 41*aa* and 42*aa* are electrically connected to neither a power supply line nor a ground line, and become a potential independent from a power supply potential and a ground potential. Therefore, in the thin-film capacitor 40, only the portion where the short-circuited small electrodes 41*aa* and 42*aa* sandwich the high dielectric layer 43 loses the capacitor function, and portions where other thin-film small electrodes 41*a* and 42*a* sandwich the high dielectric layer 43 maintain the capacitor function.

7 Claims, 14 Drawing Sheets

U.S. PATENT DOCUMENTS

2003/0102523 A1* 6/2003 Li et al. .................. 257/535
2005/0162599 A1  7/2005 Kurihara et al.

FOREIGN PATENT DOCUMENTS

| JP | 08-222709 A | 8/1996 |
| JP | 2001-68858 | 3/2001 |
| JP | 2005-019572 | 1/2005 |

* cited by examiner

PACKAGE SUBSTRATE WITH BUILT-IN CAPACITOR AND MANUFACTURING METHOD THEREOF

The application is a divisional of and claims the benefit of priority under 35 U.S.C. §120 from U.S. Ser. No. 11/341,485, filed Jan. 30, 2006, and claims the benefit of priority under U.S.C. §119 from Japanese Patent Application No. 2005-022992, the entire contents of each of which are incorporated by reference herein.

BACKGROUND OF THE INVENTION

1. Field of the Invention

The present invention relates to a package substrate with a built-in capacitor on which a semiconductor device is mounted, and a manufacturing method thereof.

2. Description of the Prior Art

Conventionally, various structures of package substrates with built-in capacitors on which semiconductor devices are mounted have been proposed. In one proposed package substrate with a built-in capacitor, a thin-film capacitor is connected between a power supply line and a ground line to decouple the lines, whereby preventing an instantaneous potential drop of the power supply line due to switching noise caused by high-speed turning on and off of the mounted semiconductor device. For example, the Japanese Published Unexamined Patent Application No. 2001-68858 discloses, as shown in FIG. 16A and FIG. 16B, a package substrate 500 with a built-in capacitor in which the capacitor 550 including dielectric layers 502 mainly made of barium titanate and electrode layers 504 mainly made of palladium, are alternately laminated. The electrode layers 504 of the capacitor 550 include power supply layers 504a and ground layers 504b, and the power supply layers 504a and the ground layers 504b are alternately disposed. The power supply layers 504a are connected to each other by means of via conductors 505 and conducted to electrode pads 506 of the outermost layer, and the ground layers 504b are connected to each other by means of via conductors 507 and conducted to the ground pads 508 of the outermost layer. This capacitor 550 is disposed in a concave portion of the package substrate 500 with the built-in capacitor.

SUMMARY OF THE INVENTION

An object of the invention is to provide a package substrate with a built-in capacitor which can maintain the performance of a built-in thin-film capacitor even when a short-circuit occurs between electrodes of the thin-film capacitor. Another object of the invention is to provide a manufacturing method for such a package substrate with a built-in capacitor.

In order to achieve at least part of the above objects, the present invention is constructed as follows.

The present invention is directed to a package substrate with a built-in capacitor, including: a plurality of power supply pads; a plurality of ground pads provided in the same layer as the power supply pads; a thin-film capacitor that includes a high dielectric layer and first and second thin-film electrodes sandwiching the high dielectric layer, where the first thin-film electrode includes a plurality of first thin-film small electrodes and the second thin-film electrode includes a plurality of second thin-film small electrodes; an insulating layer that is disposed between the thin-film capacitor and the layer with the plurality of pads; and internal wirings which wire some of the first thin-film electrodes electrically insulated from the second thin-film electrodes to make a wiring having either of a power supply potential or a ground potential, wire some of the second thin-film electrodes electrically insulated from the first thin-film electrodes to make a wiring having the other potential, and make one of the first thin-film small electrodes and one of the second thin-film small electrodes that are electrically short-circuited to each other via an unnecessary conductive portion generated in the high-dielectric layer become a potential independent from both of the ground potential and power supply potential.

In this package substrate with a built-in capacitor, the first thin-film small electrode and the second thin-film small electrode that are opposite each other and electrically short-circuited to each other via an unnecessary conductive portion (for example, a pinhole) are independent from both ground potential and power supply potential. Therefore, the unnecessary conductive portion between these small electrodes does not short-circuit other first thin-film small electrodes and second thin-film small electrodes opposite each other and electrically insulated from each other. As a result, other first thin-film small electrodes and second thin-film small electrodes opposite each other and electrically insulated from each other still fulfill the capacitor function. Therefore, even if a short-circuit occurs between electrodes of the thin-film capacitor, the thin-film capacitor can maintain the capacitor performance, the yield of the package substrate with a built-in capacitor can be prevented from deteriorating.

The present invention is also directed to a package substrate with a built-in capacitor, including: a plurality of power supply pads; a plurality of ground pads provided in the same layer as the power supply pads; a thin-film capacitor that includes a high dielectric layer and first and second thin-film electrodes sandwiching the high dielectric layer, where the first thin-film electrode includes a plurality of first thin-film small electrodes and the second thin-film electrode includes a plurality of second thin-film small electrodes; an insulating layer that is disposed between the thin-film capacitor and the layer with the plurality of pads; and internal wirings which wire some of the first thin-film electrodes that are opposed to and electrically insulated from the second thin-film electrodes to make a wiring having either of a power supply potential or a ground potential, wire some of the second thin-film electrodes that are opposed to and electrically insulated from the first thin-film electrodes to make a wiring having the other potential, and make one of the first thin-film small electrodes and one of the second thin-film small electrodes that are electrically short-circuited to each other via an unnecessary conductive portion generated in the high-dielectric layer become the same potential as the ground potential and independent from the power supply potential.

In this package substrate with a built-in capacitor, one of the first thin-film small electrode and the second thin-film small electrode opposite each other and electrically short-circuited to each other via an unnecessary conductive portion (for example, a pinhole) is connected via the conductive portion to the other thin-film small electrode wired so as to become the same potential as the ground potential although it should be set to the same potential as the power supply potential. Therefore, both the thin-film small electrodes are wired independently from the power supply potential so as not to influence other thin-film small electrodes that become the same potential as the power supply potential. As a result, other first thin-film small electrodes and second thin-film small electrodes opposite each other and electrically insulated from each other still fulfill the capacitor function. Therefore, even when a short-circuit occurs between electrodes of the thin-film capacitor, the thin-film capacitor maintains the capacitor performance, and the yield of the package substrate with a built-in capacitor can be prevented from deteriorating.

The present invention is further directed to a package substrate with a built-in capacitor, including: a plurality of power supply pads; a plurality of ground pads provided in the same layer as the power supply pads; a thin-film capacitor that includes a high dielectric layer and first and second thin-film electrodes sandwiching the high dielectric layer, where the first thin-film electrode includes a plurality of first thin-film small electrodes and the second thin-film electrode includes a plurality of second thin-film small electrodes; an insulating layer that is disposed between the thin-film capacitor and the layer with the plurality of pads; and internal wirings which wire some of the first thin-film electrodes that are opposed to and electrically insulated from the second thin-film electrodes to make a wiring having either of a power supply potential or a ground potential, wire some of the second thin-film electrodes that are opposed to and electrically insulated from the first thin-film electrodes to make a wiring having the other potential, and make one of the first thin-film small electrodes and one of the second thin-film small electrodes that are electrically short-circuited to each other via an unnecessary conductive portion generated in the high-dielectric layer become the same potential as the power supply potential and independent from the ground potential.

In this package substrate with a built-in capacitor, one of the first thin-film small electrode and the second thin-film small electrode opposite each other and electrically short-circuited to each other via an unnecessary conductive portion (for example, a pinhole) is connected to the other thin-film small electrode wired so as to become the same potential as the power supply potential, via the conductive portion although it should be set to the same potential as the ground potential. Therefore, both the thin-film small electrodes are wired independently from the ground potential so as not to influence other thin-film small electrodes that become the same potential as the ground potential. As a result, other first thin-film small electrodes and second thin-film small electrodes opposite each other and electrically insulated from each other still fulfill the capacitor function. Therefore, even when a short-circuit occurs between electrodes of the thin-film capacitor, the thin-film capacitor can maintain the capacitor performance, and the yield of the package substrate with a built-in capacitor can be prevented from deteriorating.

In the package substrate with a built-in capacitor of the invention, the high dielectric layer may be made by sintering a material that contains one, two, or more metal oxides selected from a group consisting of barium titanate ($BaTiO_3$), strontium titanate ($TiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT). Thereby, the permittivity of the thin-film capacitor can be sufficiently raised, so that the capacitance increases. And a adequate decoupling effect is maintained even in a situation that the frequency to turn the semiconductor device on/off becomes as high as several GHz through several tens of GHz (for example, 3 GHz through 20 GHz), and that an instantaneous potential drop easily occurs. It is preferable that the high dielectric layer is not sintered on the package substrate in the process of manufacturing but is prepared by sintering a high dielectric material separately in advance of being incorporated in the package substrate in the process of manufacturing. This is because, the package substrate is generally manufactured in a temperature condition of 200° C. or less, however, it is difficult to sinter the high dielectric material into ceramic in this temperature condition.

In the package substrate with a built-in capacitor of the invention, the distance between the first and second thin-film electrodes of the thin-film capacitor is preferably of 10 μm or less that does not cause substantial short-circuit unless the conductive portion is generated in the high dielectric layer. Thereby, the distance between the electrodes of the thin-film capacitor is sufficiently small, so that the capacitance of the thin-film capacitor can be increased.

In the package substrate with a built-in capacitor of the invention, the first thin-film electrode may be an aggregation of the plurality of first thin-film small electrodes obtained by cutting a solid-pattern metal foil by linear grooves, and has pass-through holes that allow passing of partial wirings of the internal wirings to electrically connect the ground pads and a ground conductor layer formed lower than the thin-film capacitor in a non-contact state, and the second thin-film electrode may be an aggregation of the plurality of second thin-film small electrodes obtained by cutting a solid-pattern metal foil by linear grooves, and has pass-through holes that allows passing of partial wirings of the internal wirings to electrically connect the power supply pads and a power supply conductor layer formed lower than the thin-film capacitor in a non-contact state. Thereby, the areas of the first and second thin-film electrodes of the thin-film capacitor can be enlarged, so that the capacitance of this thin-film capacitor can be increased. The solid patterns can be provided on the entire surface of the high dielectric layer or a part of the surface, however, the solid patterns are preferably provided at least below the semiconductor device.

The package substrate with a built-in capacitor of the invention may further include a stress relaxation portion that can relax a stress generated between the package substrate and a semiconductor device mounted thereon. Thereby, even when a stress (for example, a stress caused by a thermal expansion coefficient difference) is generated between the mounted semiconductor device and the package substrate, the stress relaxation portion absorbs the stress, so that a defect such as a crack in, for example, the thin and fragile high dielectric layer hardly occurs. In this case, the stress relaxation portion may be formed only below the mounted semiconductor device. The stress caused by a thermal expansion difference comes out mainly below the semiconductor device, so that by forming the stress relaxation portion at this portion, the material cost can be reduced. A material of such a stress relaxation portion is not especially limited, and for example, an organic resin sheet such as a modified epoxy-based resin sheet, a polyphenylene ether-based resin sheet, a polyimide-based resin sheet, a cyanoester-based resin sheet, and an imide-based resin sheet can be used. These organic resin sheets can contain a polyolefin-based resin or a polyimide-based resin as a thermoplastic resin, a silicone resin as a thermosetting resin, and a rubber-based resin such as SBR, NBR, or urethane, and can contain fiber-like, filler-like, or flat materials of inorganic materials such as silica, alumina, and zirconia. The Young's modulus of the stress relaxation portion is preferably 10 through 1000 MPa. By setting the Young's modulus of the stress relaxation portion in this range, even when a stress is generated due to a thermal expansion coefficient difference between the semiconductor device to be mounted on a mounting portion and the wiring board, the stress can be relaxed, so that relative permittivity lowering and cracks can be prevented.

The present invention is further directed to a manufacturing method of a package substrate with a built-in capacitor, including the steps of: (a) forming, on the package substrate in the middle of preparation, a thin-film capacitor that includes a high dielectric layer, a first thin-film electrode having a plurality of first thin-film small electrodes, and a second thin-film electrode having a plurality of second thin-film small electrodes, where the first and second thin-film electrodes sandwich the high dielectric layer; and (b) performing an inspection before or after the step (a) to determine whether any of the plurality of first thin-film small electrodes is short-circuited to any of the plurality of second thin-film electrodes via an unnecessary conductive portion generated in the high-dielectric layer. The manufacturing method further includes the step of (c) according to the result of the inspection, wiring some of the first thin-film electrodes electrically insulated from the second thin-film electrodes to make a wiring having either of a power supply potential or a ground potential, wiring some of the second thin-film electrodes electrically insulated from the first thin-film electrodes to make a wiring having the other potential, and making one of the plurality of first thin-film small electrodes and one of the plurality of second thin-film small electrodes that are opposed to and electrically short-circuited to each other via an unnecessary conductive portion generated in the high-dielectric layer in a state where any of the following conditions (1) to (3) are fulfilled: (1) both of the electrically short-circuited first and second thin-film small electrodes become a potential independent from both ground potential and power supply potential; (2) both of the opposed and electrically short circuited first and second thin-film small electrodes become the same potential as ground potential and independent from power supply potential; or (3) both of the opposed and electrically short circuited first and second thin-film small electrodes become the same potential as power supply potential and independent from ground potential.

A package substrate obtained by the manufacturing method above is any of the package substrate of the invention described above. Therefore, even if a short-circuit occurs between electrodes of the thin-film capacitor, the thin-film capacitor can maintain the capacitor performance, the yield of the package substrate with a built-in capacitor can be prevented from deteriorating.

DESCRIPTION OF THE PREFERRED EMBODIMENTS

Figure 1:
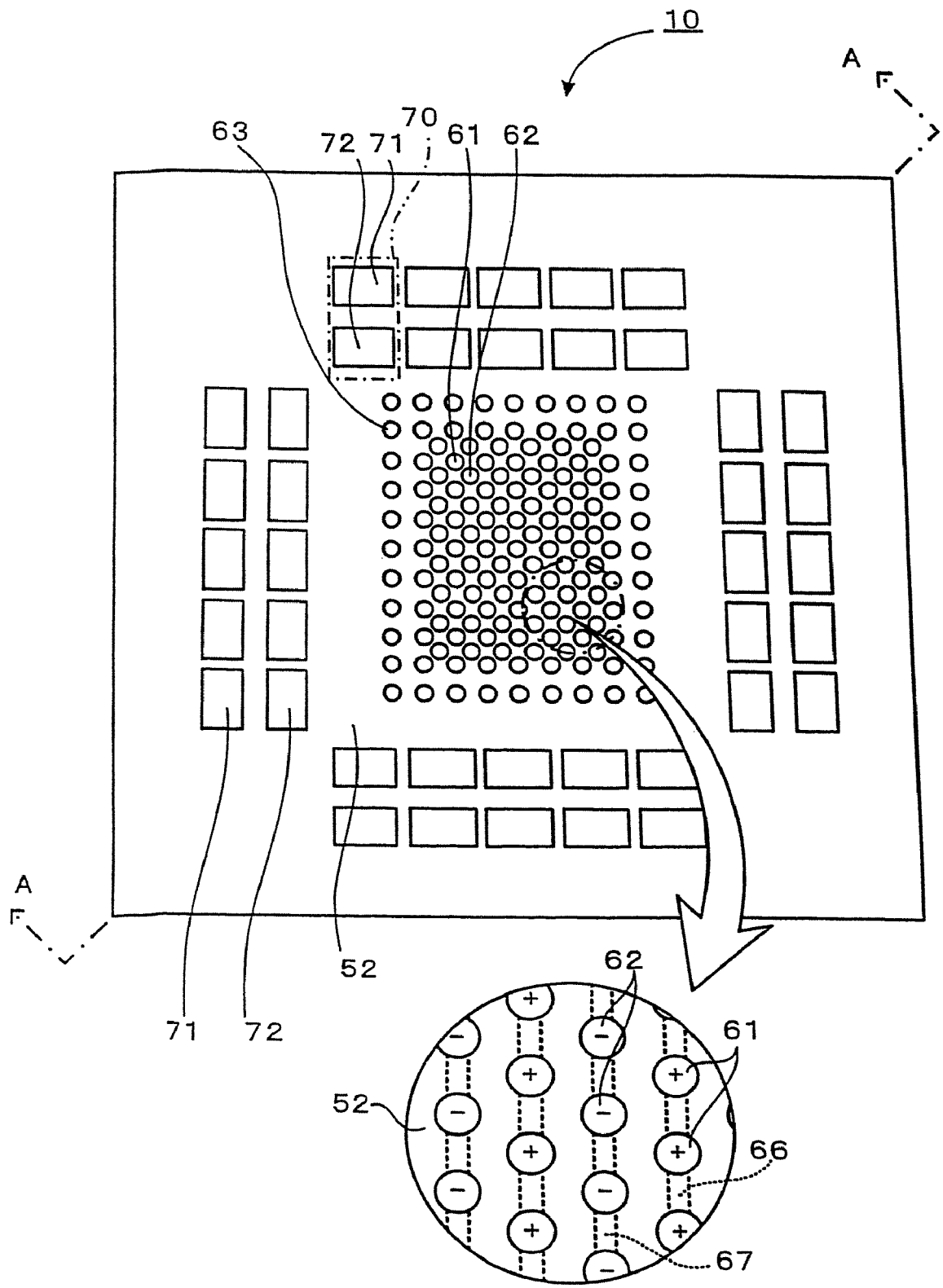
FIG. 1 is a plan view of a package substrate 10.
Figure 3:
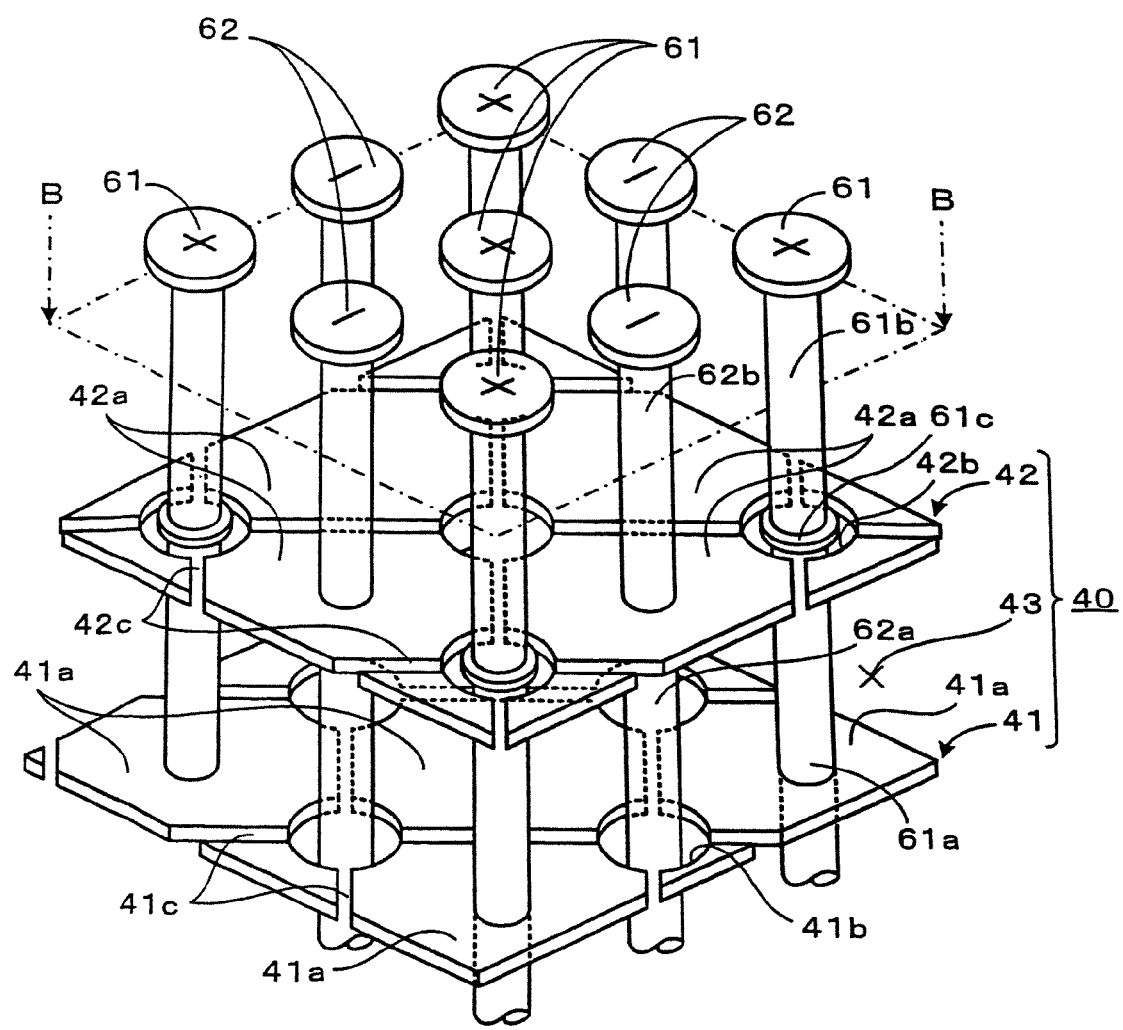
FIG. 3 is a perspective view schematically showing a thin-film capacitor 40.
Figure 4:
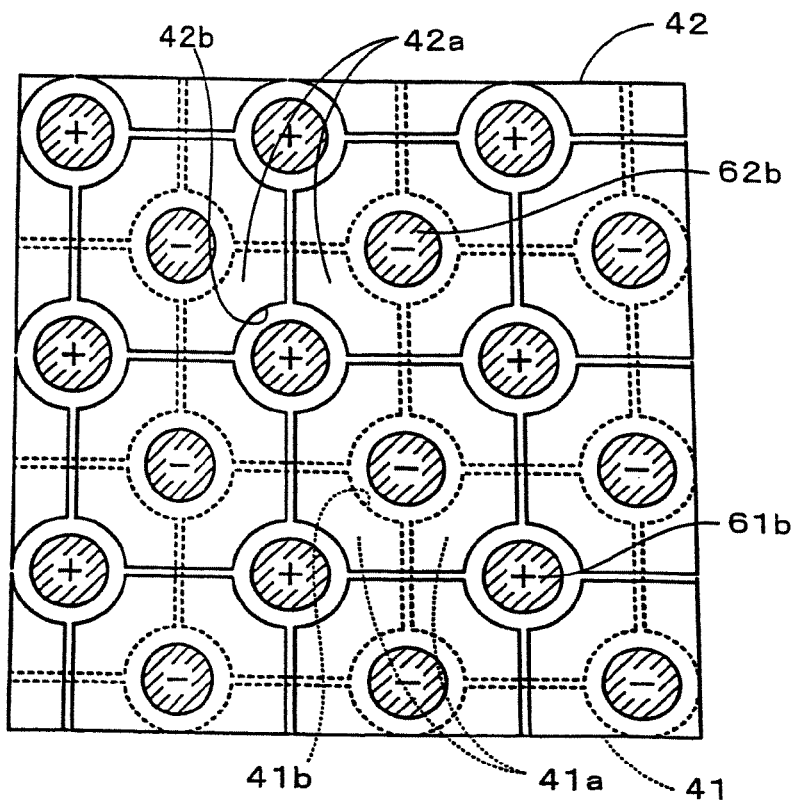
FIG. 4 is a sectional view along B-B of FIG. 3.

Next, an embodiment of the invention will be explained based on the drawings. FIG. 1 is a plan view of a package substrate 10 of an embodiment of the invention (the circled section is a partial enlarged view), FIG. 2 is a sectional view (of a main portion) along A-A of FIG. 1, FIG. 3 is a perspective view schematically showing a thin-film capacitor 40, and FIG. 4 is a sectional view along B-B of FIG. 3.

The package substrate 10 of this embodiment includes, as shown in FIG. 1, a plurality of power supply pads 61, a plurality of ground pads 62 provided in the same layer as the power supply pads 61, a plurality of signal pads 63 provided around the power supply pads 61 and the ground pads 62, power supply interconnections 66 that electrically connect the power supply pads 61 to each other, ground interconnections 67 that electrically connect the plurality of ground pads 62 to each other, and chip capacitor providing regions 70 provided around the pads 61 through 63. In this embodiment, the pads 61, 62, and 63 and the power supply pads 71 and the ground pads 72 of the chip capacitor providing regions 70 are exposed to the outside from the solder resist layer 52 as the outermost layer, and the power supply interconnections 66 and the ground interconnections 67 are formed in the same layer as the power supply pads 61 and the ground pads 62. The package substrate 10 further includes, as shown in FIG. 2, a core substrate 20, a build-up layer 30 laminated on the surface of this core substrate 20, a thin film capacitor 40 laminated on this build-up layer 30 via an interlayer dielectric layer 46, a stress relaxation layer 50 with electrical insulation laminated on this thin-film capacitor 40, and a solder resist layer 52 laminated on this stress relaxation layer 50. On the respective pads 61 and 62 exposed from the solder resist layer 52, solder bumps 61d and 62d are formed, respectively.

Figure 2:
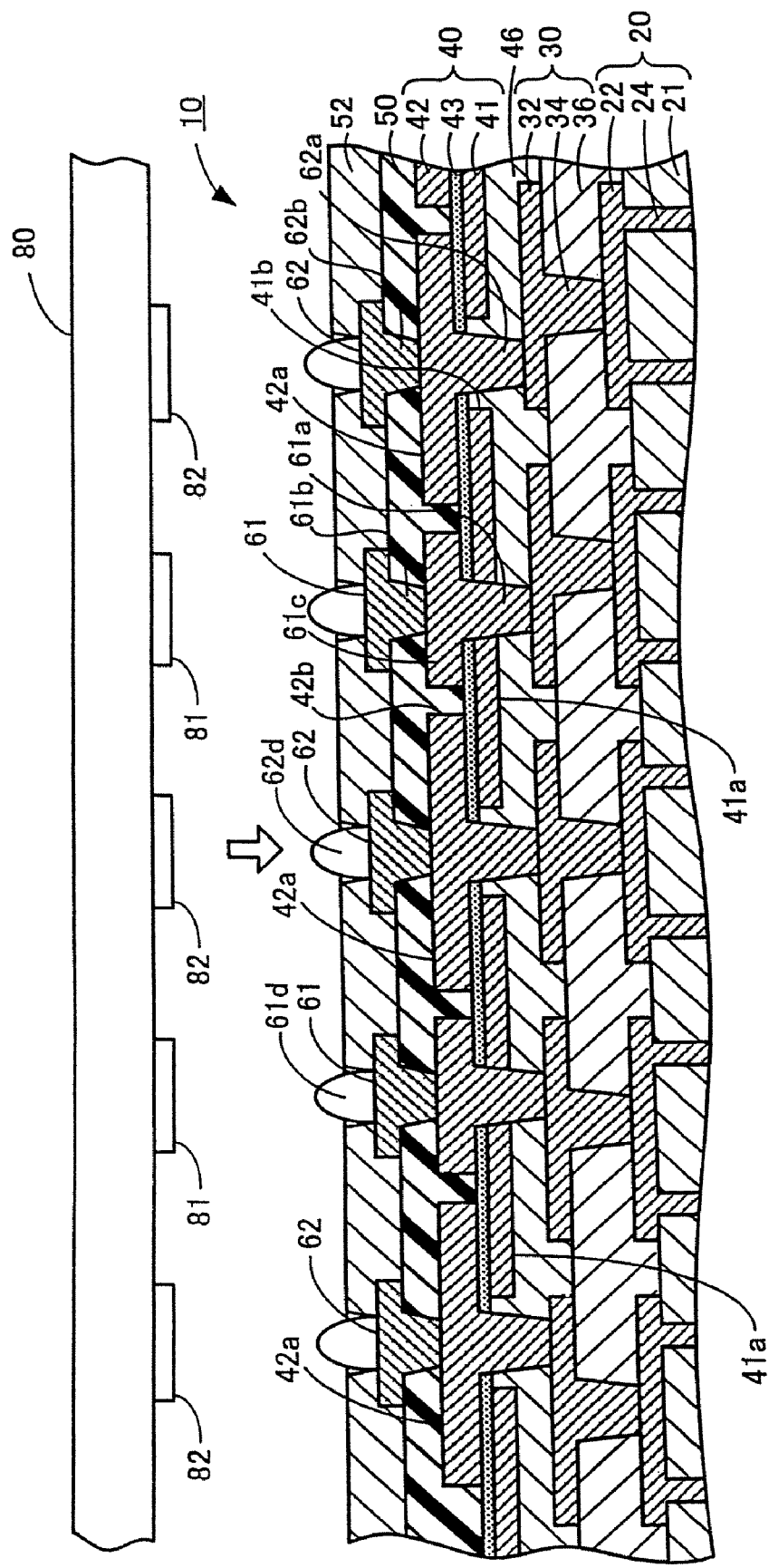
FIG. 2 is a sectional view along A-A of FIG. 1.

The core substrate 20 includes, as shown in FIG. 2, a core substrate main body 21 made of a BT (bismaleimide-triazine) resin or glass epoxy substrate, etc., copper-made conductor layers 22 (FIG. 2 shows only the surface side) formed so as to have predetermined wiring patterns on both surfaces of the core substrate main body 21, and through-hole conductors 24 that are made of copper formed on the inner circumferential surfaces of through holes penetrating the surface and to the back surface of the core substrate main body 21. The conductor layers 22 are electrically connected to each other through the through-hole conductors 24.

The build-up layer 30 is formed by laminating a resin insulating layer 36 and a conductor layer 32 on the surface of the core substrate 20. Herein, the conductor layer 32 is formed so as to have a predetermined pattern, and is electrically connected to the conductor layer 22 lower than it by means of via holes 34 penetrating the surface to the back surface of the resin insulating layer 36. Such a build-up layer 30 is formed by the known subtractive method or additive method (including the semi-additive method or full-additive method), and for example, the build-up layer is formed as follows. Namely, a resin sheet to become the resin insulating layer 36 is affixed to the surface of the core substrate 20. Herein, the Young's modulus of the resin insulating layer 36 at normal temperatures is 2 through 7 GPa. This resin sheet is made of a modified epoxy-based resin sheet, a polyphenylene ether-based resin sheet, a polyimide-based resin sheet, a cyanoester-based resin sheet, or the like, and its thickness is about 20 through 80 µm. Inorganic materials such as silica, alumina, zirconia, etc., may be dispersed in the resin. In this embodiment, a thermosetting resin film (product name: ABF-45SH, Young's modulus: 3.0 GPa) manufactured by AJINOMOTO was used. Next, in the affixed resin sheet, blind holes are formed by irradiating a carbon dioxide gas laser, UV laser, YAG laser, or excimer laser to form the resin sheet as the resin insulating layer 36, and then a conductor layer with a solid pattern is formed so as to cover the surface of this resin insulating layer 36 (including the insides of the blind holes). This solid-pattern conductor layer is formed by applying electrolytic copper plating after electroless copper plating. The conductor layer inside the blind through holes becomes the via holes 34. To form a predetermined wiring pattern on the conductor layer with a solid pattern, a resist with the same pattern as the wiring pattern is printed on the conductor layer. Thereafter, it is treated with an etching solution and only resist portions of the conductor layer with a solid pattern remain, whereby the conductor layer 32 with the predetermined wiring pattern is formed, and then the resist is peeled off (tenting). FIG. 2 illustrate one build-up layer 30, however, a build-up multilayer may be formed by repeating this step. FIG. 2 illustrates the build-up layer 30 formed on the surface of the core substrate 20, however, the build-up layer 30 may be formed on the back surface of the core substrate 20.

The thin-film capacitor 40 includes, as shown in FIG. 2, a high-dielectric layer 43 obtained by sintering a ceramic-based high dielectric material at a high temperature, and a first thin-film electrode 41 and a second thin-film electrode 42 made of copper sandwiching this high dielectric layer 43. In this embodiment, the first thin-film electrode 41 is a power supply electrode, that is, an anode, and the second thin-film electrode 42 is a ground electrode, that is, a cathode.

The first thin-film electrode 41 is formed by dividing a so-called solid pattern into a plurality of first thin-film small electrodes 41a as shown in FIG. 2 through FIG. 4, and each first thin-film small electrode 41a is electrically connected to a power supply post 61a penetrating vertically this first thin-film small electrode 41a at the penetrating portion. This power supply post 61a is connected to a power supply line of the conductor layer 32 of the build-up layer 30, and a circular land 61c independent from this second thin-film electrode 42 is included in the same layer as the second thin-film electrode 42. This land 61c is electrically insulated from the second thin-film small electrode 42a by a clearance hole 42b provided in the second thin-film electrode 42, and is electrically connected to the power supply pad 61 via the via hole 61b penetrating the stress relaxation layer 50. Therefore, each first thin-film small electrode 41a is electrically connected to the power supply pad 61 via the power supply post 61a, the land 61c, and the via hole 61b, and electrically connected to the power supply line as a lower layer via the power supply post 61a. However, each first thin film small electrode 41a is insulated from the ground line. In this embodiment, the respective power supply pads 61 are electrically connected with each other by power supply interconnections 66 (see FIG. 1) formed higher than the thin-film capacitor 40, so that the first thin-film small electrodes 41a become the same potential (power supply potential).

The second thin-film electrode 42 is also formed by dividing a solid pattern into a plurality of second thin-film small electrodes 42a, and each thin-film small electrode 42a is electrically connected to a ground post 62a extending downward and a via hole 62b extending upward. The ground post 62a is electrically insulated from the first thin-film small electrode 41a by a clearance hole 41b provided in the first thin-film electrode 41, and electrically connected at the lower end side to a ground line of the conductor layer 32 of the build-up layer 30. The via hole 62b penetrates the stress relaxation layer 50 and electrically connects the ground pad 62 and the second thin-film small electrode 42a. Therefore, each second thin-film small electrode 42a is electrically connected to the ground line lower than it via the ground post 62a, and electrically connected to the ground pad 62 by means of the via hole 62b. However, each thin-film small electrode 42a is insulated from the power supply line. In this embodiment, the ground pads 62 are electrically connected with each other by ground interconnections 67 (see FIG. 1) formed higher than the thin-film capacitor 40, so that the respective second thin-film small electrodes 42a become the same potential (ground potential).

The high dielectric layer 43 is formed by processing a thin film of 0.1 through 10 µm from a high dielectric material containing one or two or more metal oxides selected from a group consisting of $BaTiO_3$, $SrTiO_3$, $TaO_3$, $Ta_2O_5$, PZT, PLZT, PNZT, PCZT, and PSZT and then sintering the thin film into ceramic. The thickness of this high dielectric layer 43 (that is, the distance between the first and second thin-film electrodes 41 and 42) is 10 µm or less, and this distance is set so that a short-circuit does not substantially occur unless a pinhole or the like is formed.

Figure 5:
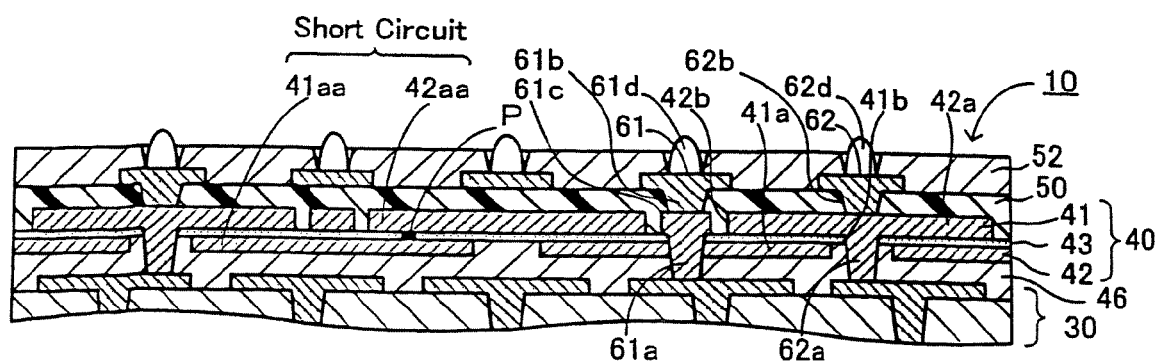
FIG. 5 is a partial sectional view of a package substrate including a pinhole.
Figure 6:
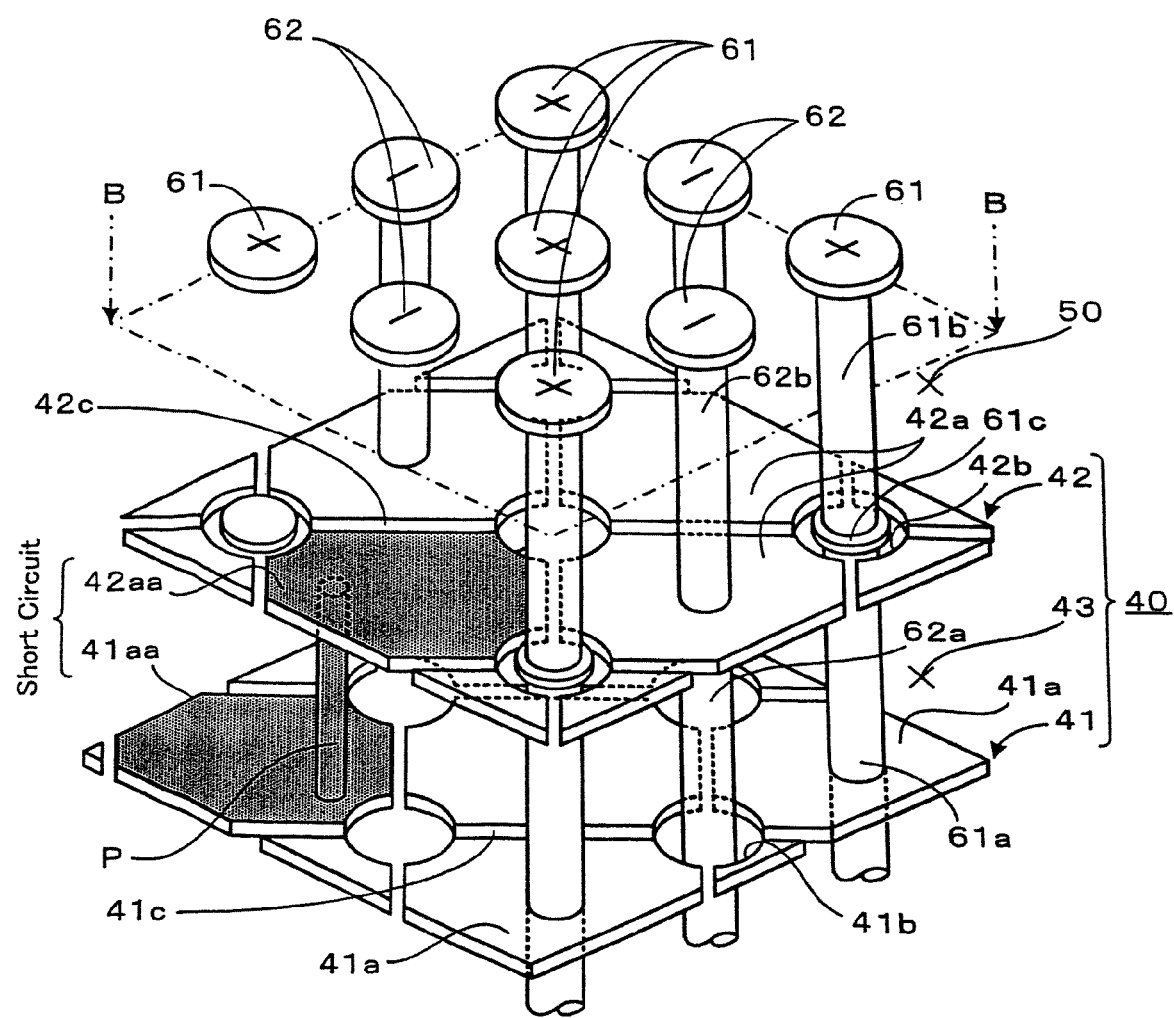
FIG. 6 is a schematic perspective view of a thin-film capacitor including a pinhole.

Herein, FIG. 5 is a partial sectional view of a package substrate in which some of first and second thin-film small electrodes are short-circuited, and FIG. 6 is a schematic perspective view of a thin-film capacitor of this package substrate. As shown in FIG. 5 and FIG. 6, when a first thin-film small electrode 41aa and a second thin-film small electrode 42aa which are electrically short-circuited via a pinhole P in the high dielectric layer 43 are included among the plurality of first thin-film small electrodes 41a and the plurality of second thin-film small electrodes 42a, the power supply post 61a and the via hole 61b are not formed in the first thin-film small electrode 41aa, and the ground post 62a and the via hole 62b are not formed in the second thin-film small electrode 42aa. As a result, the short-circuited small electrodes 41aa and 42aa are electrically connected to neither the power supply line nor the ground line, and become a potential independent from the power supply potential and the ground potential. Thus, in the thin-film capacitor 40, the capacitor function is lost only in the portion where the short-circuited small electrodes 41aa and 42aa sandwich the high dielectric layer 43, while the capacitor function is maintained in portions where other thin-film small electrodes 41a and 42a sandwich the high dielectric layer 43.

Referring to FIG. 2 again, the stress relaxation layer 50 is laminated on the thin-film capacitor 40, and is made of an elastic material. The elastic material is not especially limited, and may be made of, for example, an organic resin sheet such as a modified epoxy-based resin sheet, a polyphenylene ether-based resin sheet, a polyimide-based resin sheet, a cyanoester-based resin sheet, and an imide-based resin sheet. These organic resin sheets may contain a polyolefin-based resin and a polyimide-based resin as a thermoplastic resin, a silicone resin as a thermosetting resin, and a rubber-based resin such as SBR, NBR, and urethane. It can also contain fiber-like, filler-like, or flat materials of inorganic materials such as silica, alumina, and zirconia. Preferably, the Young's modulus of this stress relaxation layer 50 is as low as 10 through 1000 MPa. At the Young's modulus of the stress relaxation layer 50 in this range, even when a stress is generated due to a difference in the thermal expansion coefficient between a semiconductor device 80 to be mounted and the package substrate 10, this stress can be relaxed. The same material as the resin insulating layer 36 is may be used for forming the stress relaxation layer 50.

The semiconductor device 80 is mounted on the surface of the package substrate 10. In a region just below the semiconductor device 80 of this mounting surface, the power supply pads 61 and ground pads 62 are arranged in a lattice or staggered pattern, and signal pads 63 are arranged around the region (see FIG. 1). Furthermore, a plurality of chip capacitor providing regions 70 are formed around the signal pads 63. A plurality of pairs of power supply pads 71 and ground pads 72 for connecting power supply terminals and ground terminals of chip capacitors to each other are formed In the chip capacitor regions 70. The power supply pads 71 are connected to the anode of an external power supply via the first thin-film electrode 41 of the thin-film capacitor 40, and the ground pads 72 are connected to the cathode of the external power supply via the second thin-film electrode 42.

The solder resist layer 52 is opened at positions corresponding to the pads 61, 62, 63, 71, and 72. For example, regarding the solder bumps 61d on the power supply pads 61 and the solder bumps 62d on the ground pads 62, this solder resist layer 52 function as a solder dam that prevents melted solder from flowing out to the surrounding when mounting the semiconductor device 80.

Next, a usage example of the package substrate 10 thus configured will be explained. First, the power supply terminals and the ground terminals of chip capacitors are joined by solder to the power supply pads 71 and the ground pads 72 of the chip capacitor providing regions 70. Then, the semiconductor device 80 is placed on the package substrate 10. The semiconductor device 80 is placed so that a number of power supply terminals 81 and ground terminals 82 provided on the back surface of the semiconductor device 80 are aligned with the solder bumps 61d of the corresponding power supply pads 61 and solder bumps 62d of the ground pads 62. Subsequently, the terminals and the pads are reflow-joined by solder. Thereafter, the surface opposite the mounting surface of the package substrate 10 is attached to another printed reflow-joined board such as a mother board. Here, solder bumps are formed in advance on pads formed on the back surface of the package substrate 10, and the package substrate is reflow-joined by contacting the solder bumps with corresponding pads on the other printed wiring board.

Next, a manufacturing example of the package substrate 10 of this embodiment will be explained. Since the procedures for manufacturing the core substrate 20 and the build-up layer 30 are generally known, the explanation regards mainly procedures for manufacturing the thin-film capacitor 40 and the stress relaxation layer 50. FIG. 7 through FIG. 12 are explanatory views of the procedures.

Figure 7A:
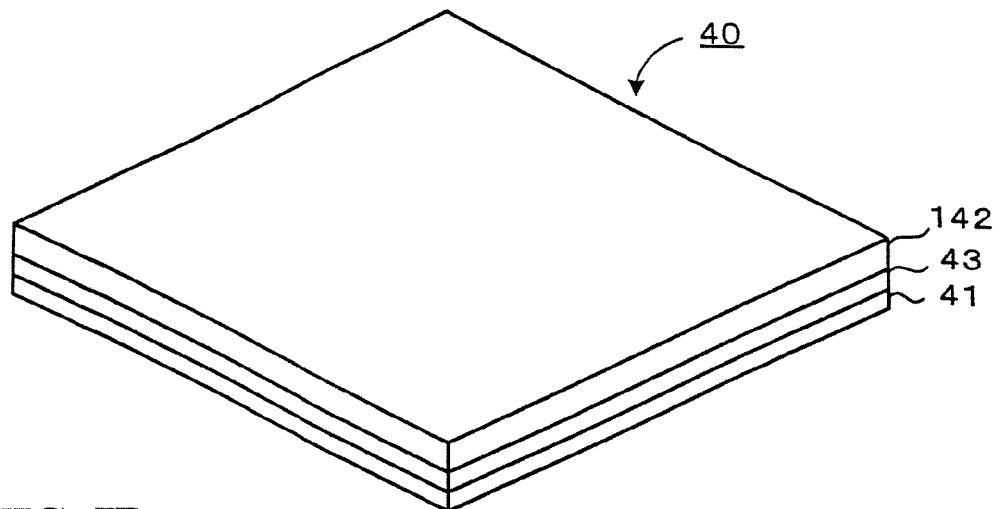
FIGS. 7A-7C are explanatory views of processing steps of a thin-film capacitor 40.

First, the thin-film capacitor 40 shown in FIG. 7A was manufactured. The procedures for manufacturing this thin-film capacitor 40 will be explained below.

(1) In dry nitrogen, diethoxybarium and titanium bitetraisopropoxyde weighed to a concentration of 1.0 mol/liter were dissolved in a mixed solvent of dehydrated methanol and 2-methoxyethanol (volume ratio: 3 to 2), and stirred for three days under an atmosphere of nitrogen at a room temperature to prepare an alcoxide precursor composition solution of barium and titanium. The prepared precursor composition solution was stirred while keeping it at 0° C., and then hydrolyzed by atomizing water decarbonated in advance in a nitrogen gas stream at a speed of 0.5 microliters per minute.

(2) The sol-gel solution thus prepared was passed through a filter of 0.2 microns to filtrate precipitate.

(3) The filtrate prepared by the procedure (2) was spin-coated for one minute at 1500 rpm on a copper foil (to become the first thin-film electrode 41) with a thickness of 12 µm. This spin-coated substrate was dried for 3 minutes on a hot plate kept at 150° C. Thereafter, the substrate was inserted in an electrical furnace kept at 850° C., and then sintered for 15 minutes. The viscosity of the sol-gel solution was adjusted so that the film thickness to be obtained by a series of spin-coating, drying, and sintering became 0.03 µm. Nickel, platinum, gold, silver, and the like can also be used as the first thin-film electrode 41 instead of copper.

(4) A high dielectric layer 43 of 1.2 µm was obtained by repeating 40 times the series of spin-coating, drying, and sintering.

(5) Thereafter, a copper layer was formed on the high dielectric layer 43 by using a vacuum deposition apparatus for performing sputtering, etc., and 10 µm of copper was further added onto this copper layer by means of electrolytic plating, whereby a copper foil 142 (that will become a part of the second thin-film electrode 42, later) was formed. Thus, the thin-film capacitor 40 was obtained. The dielectric characteristics were measured with the IMPEDANCE/GAIN PHASE ANALYZER (manufactured by Hewlett-Packard, product name: 4194A) in the conditions of a frequency of 1 kHz, a temperature of 25° C., and an OSC level of 1V, and as a result, the relative permittivity was 1,850. The vacuum deposition may be performed to form a metal layer of platinum, gold, or the like can be formed, and by electrolytic plating, a metal layer of nickel, tin, or the like, instead of copper. The high dielectric layer 43 was made of Barium titanate here, however, the high dielectric layer 43 is made of any of strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT), by using other sol-gel solutions.

The following is another possible method for manufacturing the thin-film capacitor 40. Namely, barium titanate powder (HPBT series manufactured by Fuji Titanium Industry Co., Ltd.) is dispersed in a binder solution mixed with 5 parts by weight of polyvinyl alcohol, 50 parts by weight of pure water, and one part by weight of dioctyl phthalate or dibutyl phthalate as a solvent-based plasticizer with respect to the total weight of the barium titanate powder, printed in a thin-film form with a thickness of 5 through 7 µm on a copper foil with a thickness of 12 µm (to become the first thin-film electrode 41) by using a roll coater, a doctor blade, α coater or the like, and dried for 1 hour at 60° C., 3 hours at 100° C., one hour at 120° C., and 3 hours at 150° C. to form an unsintered layer. Other than $BaTiO_3$, a paste containing one, two or more metal oxides selected from a group consisting of $SrTiO_3$, $TaO_3$, $Ta_2O_5$, PZT, PLZT, PNZT, PCZT, and PSZT can also be printed in a thin film form with a thickness of 0.1 through 10 µm by using a printer such as a roll coater or a doctor blade, and dried to form an unsintered layer. After printing, this unsintered layer is sintered at a temperature of 600 through 950° C. to obtain a high dielectric layer 43. Thereafter, a copper layer is formed by using sputtering, etc., with a vacuum deposition apparatus on the high dielectric layer 43, and about 10 µm of copper was added onto this copper layer by electrolytic plating, whereby a copper foil 142 (to become a part of the second thin-film electrode 42, later) is formed. The vacuum deposition may be performed to form a metal layer of platinum, gold, or the like, instead of copper, and the electrolytic plating may be performed to form a metal layer of nickel, tin, or the like, instead of copper. Sputtering that targets barium titanate can also be used.

Figure 7B:
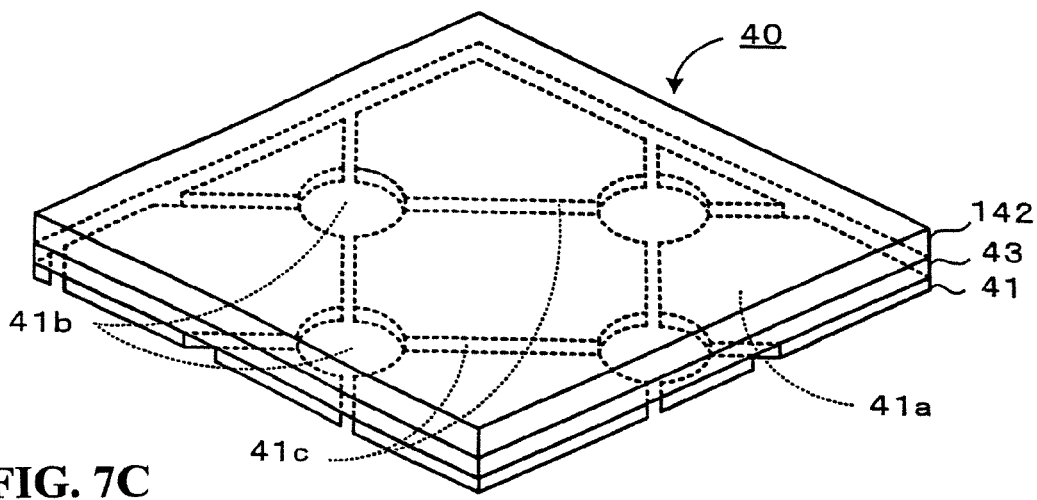

Subsequently, as shown in FIG. 7B, the first thin-film electrode 41 of the thin-film capacitor 40 was divided into a plurality of first thin-film small electrodes 41a by linear grooves 41c, and clearance holes 41b were formed. In detail, a resist was laminated on the first thin-film electrode 41 and exposed and developed via a photo mask to form a resist pattern so as to cover regions except for the clearance holes 41b and the lattice-like linear grooves 41c to be formed, and then treated with an etching solution to remove the portions that were not covered by the resist of the first thin-film electrode 41, whereby forming the clearance holes 41b and the lattice-like linear grooves 41c, and then the resist was separated off. As a result, the first thin-film electrode 41 was divided into the plurality of first thin-film small electrodes 41a by the linear grooves 41c. Herein, the groove widths of the linear grooves 41c were set so as to keep adjacent first thin-film small electrodes 41a insulated from each other when an insulating resin was filled in the linear grooves 41c. In the process of etching, a copper cupric chloride etching solution was used, and the etching was applied for a short period of time to a depth slightly eroding the high dielectric layer 43.

Figure 7C:
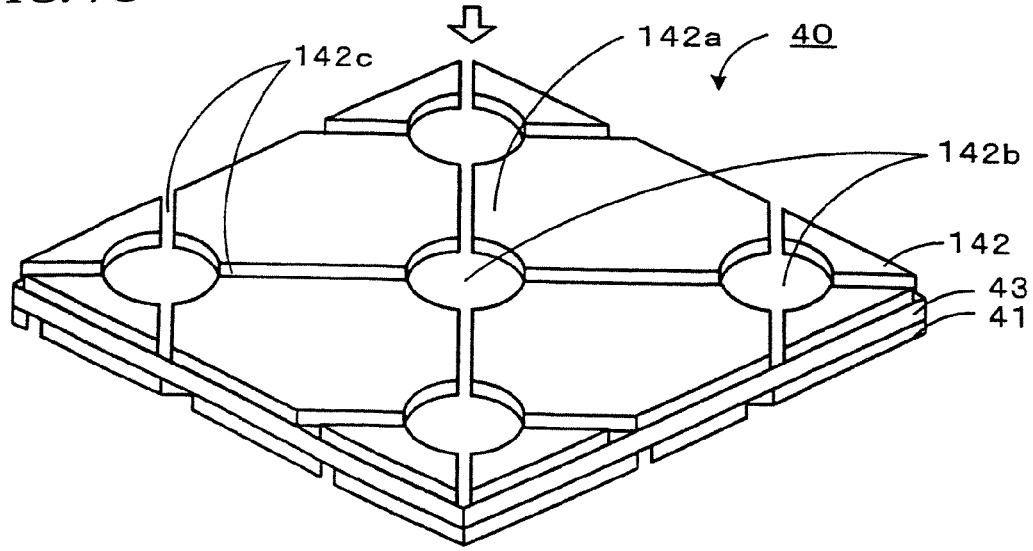

Subsequently, as shown in FIG. 7C, the copper foil 142 of this thin-film capacitor 40 was divided into a plurality of small copper pieces 142a by a plurality of linear grooves 142c, and clearance holes 142b were formed. Herein, the small copper pieces 142a were formed so that their centers were positioned on the center lines of the clearance holes 41b, and the clearance holes 142b were formed so that their centers were positioned on the center lines of the first thin-film small electrodes 41a. In detail, a resist was laminated on the copper foil 142 and exposed and developed via a photo mask to form a resist pattern so as to cover the regions except for the clearance holes 142b and the lattice-like linear grooves 142c to be formed, and treated with an etching solution to remove portions that were not covered by the resist of the copper foil 142, whereby forming the clearance holes 142b and the lattice-like linear grooves 142c in the copper foil 142, and then the resist was separated off. As a result, the copper foil 142 was divided into a plurality of small copper pieces 142a by the linear grooves 142c. The groove width of the linear grooves 142c is set so as to maintain the insulation between the adjacent small copper pieces 142a when an insulating resin is filled in the linear grooves 142c. In the process of etching, a copper cupric chloride etching solution was used, and etching was applied for a short period of time to a depth slightly eroding the high dielectric layer 43.

Figure 8:
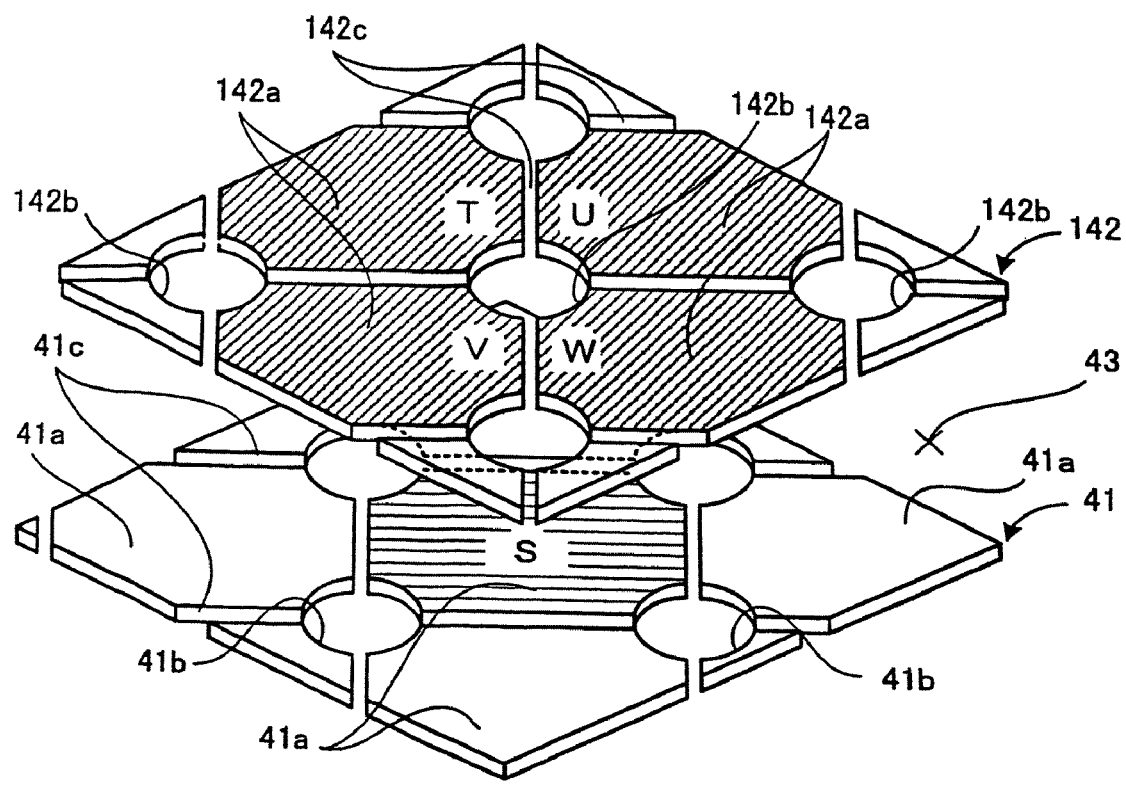
FIG. 8 is an explanatory view of inspection steps to inspect whether a pinhole has been generated.

Thereafter, an inspection was performed to search for a portion where a pinhole was generated in the high dielectric layer 43. At this stage, the first thin-film electrode 41 and the copper foil 142 are in the state schematically shown in FIG. 8. Namely, the first thin-film electrode 41 is divided into the plurality of first thin-film small electrodes 41a by the linear grooves 41c, and the copper foil 142 is also divided into the plurality of small copper pieces 142a by the linear grooves 42c. Among the first thin-film electrodes 41a, the first thin-film small electrode S shown by being shaded in FIG. 8 is explained as an example. In the plan view of the copper foil 142, the first thin-film small electrode S overlaps via the high dielectric layer 43 the four small copper pieces T, U, V, and W shown by being shaded in FIG. 8 among the small copper pieces 142a of the copper foil 142 higher than the first thin-film small electrode. Therefore, by inspecting whether a current can be flown between the first thin-film small electrode S and the respective small copper pieces T, U, V, and W, it is found whether a pinhole has been generated in the high-dielectric layer 43 sandwiched by the first thin-film small electrode S and the small copper pieces T, U, V, and W. When a current cannot be flown between the first thin-film small electrode S and the respective small copper pieces T, U, V, and W, it is judged that an unnecessary conductive portion such as a pinhole is not generated in the high dielectric layer 43. On the other hand, when a current is flown only between the first thin-film small electrode S and, for example, the small copper piece U, it is judged that an unnecessary conductive portion such as a pinhole has been generated in the high dielectric layer 43 between the first thin-film electrode S and the small copper piece U. Then, the inspection was performed for all first thin-film small electrodes 41a and second thin-film small electrodes 141 opposite each other, and when it was judged that an unnecessary conductive portion was not generated, the package substrate 10 was manufactured through the steps described later so as to finally have the sectional structure of FIG. 2. On the other hand, when it was judged that an unnecessary conductive portion was generated, the package substrate 10 was manufactured so as to finally have the sectional structure of FIG. 5.

When a portion with a pinhole was not found in the high dielectric layer 43 as a result of the inspection, the package substrate 10 was formed according to the procedures of FIG. 9 and FIG. 10. First, as shown in FIG. 9A, a substrate with a build-up layer 30 formed on at least one side of the core substrate 20 (not shown in FIG. 9, see FIG. 2) was prepared, and on the build-up layer 30 of this substrate, by means of a pin laminating method, an interlayer dielectric layer 46 and the thin-film capacitor 40 shown in FIG. 7C were aligned and affixed in the conditions under a temperature of 50 through 150° C. and a pressure of 0.5 through 1.5 MPa, and then dried for 30 minutes at 150° C. (see FIG. 9B). Thereby, in the clearance holes 41b and the linear grooves 41c (see FIG. 7B) of the first thin-film electrode 41, the interlayer dielectric layer 46 was filled. Subsequently, at the positions above the centers of the clearance holes 41b and the central positions of the clearance holes 142b of the substrate while being manufactured, blind holes 161a and 162a reaching the surface of the conductor layer 32 of the build-up layer 30 were formed by a carbon dioxide gas laser, UV laser, YAG laser, or excimer laser (see FIG. 9C). At this time, the output of the laser was adjusted so as to make the diameters of the blind holes 162a smaller than that of the clearance holes 41b. Herein, no unnecessary conductive portion such as a pinhole was generated in the high dielectric layer 43, so that the blind holes 161a and 162a were formed in all clearance holes 41b and 142b. Subsequently, the surface was roughed by applying black oxidation, and the roughed surface was supplied with a catalyst and then subjected to electroless copper plating, and further subjected to electrolytic copper plating, whereby filling the insides of the blind holes 161a and 162a with copper and covering the entire surface with copper (see FIG. 9D). The copper filled inside the blind holes 161a and 162a becomes power supply posts 61a and ground posts 62a of FIG. 2. The upper surface of the high dielectric layer 43 becomes a solid-pattern copper layer 144 by being integrated with the small copper pieces 142a due to copper filled in the linear grooves 142c.

Figure 9A:
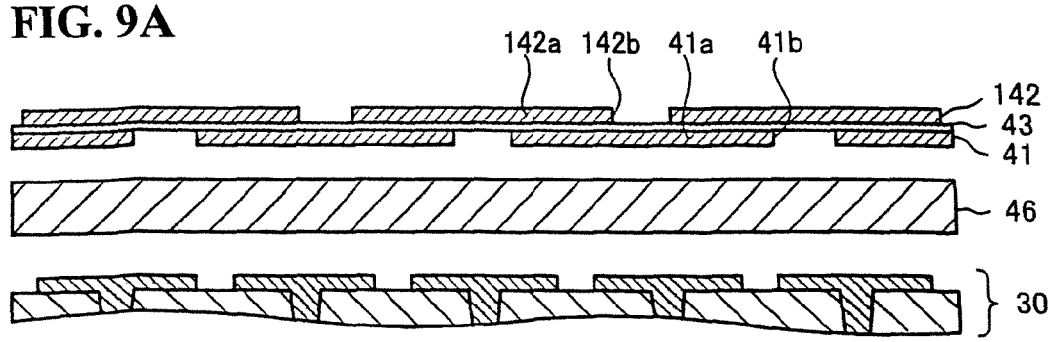
FIGS. 9A-9E are explanatory views of manufacturing processes for a package substrate 10 including no pinhole.
Figure 9B:
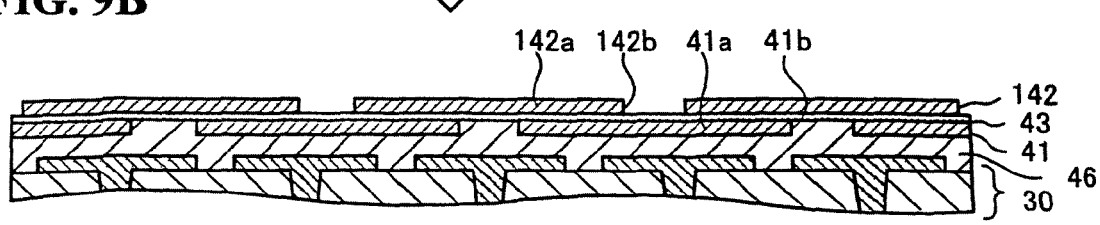
Figure 9C:
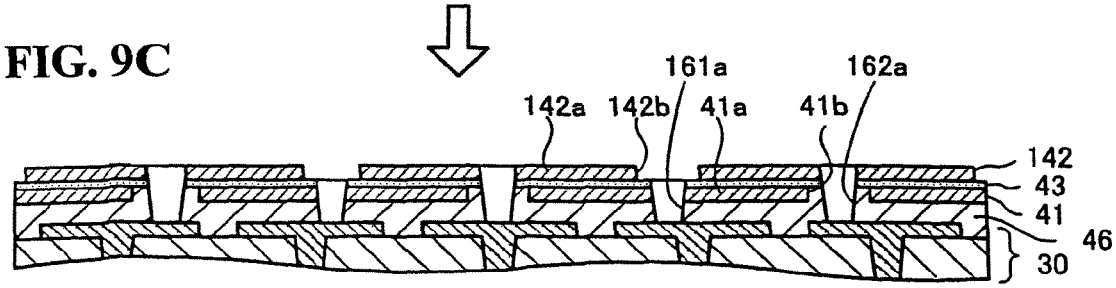
Figure 9D:
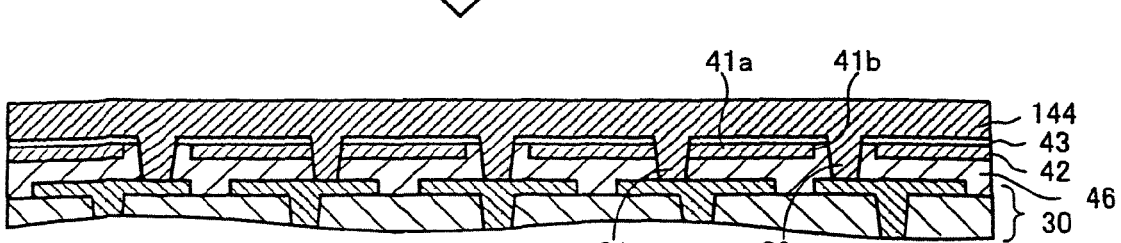
Figure 9E:
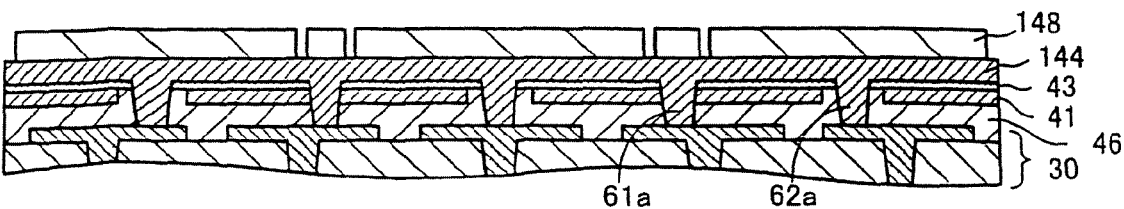

Subsequently, after the thickness of the copper layer 144 was set to 12 μm by applying half-etching to the copper layer 144, to form a predetermined wiring pattern on this thinned copper layer 144, a resist 148 having the same pattern as the wiring pattern was printed (see FIG. 9E). At this time, the resist 148 was printed on the regions excluding both the regions of the linear grooves 142c that divided the copper foil 142 to form the small copper pieces 142a and donut-shaped regions obtained by subtracting the lands 61c (see FIG. 2) smaller in diameter than the clearance holes 142b from the clearance holes 142b. Thereafter, the resist was treated with an etching solution to remain at only the portions of the solid-pattern copper layer 144 below the resist 148, whereby forming the second thin-film small electrodes 42a, the clearance holes 42b, and the lands 61c on the upper surface of the high dielectric layer 43 (see FIG. 10A), and forming the linear grooves 42c (see FIG. 6) between the second thin-film small electrodes 42a (tenting). Hereinafter, the copper layer 144 is referred to as a second thin-film electrode 42.

Figure 10A:
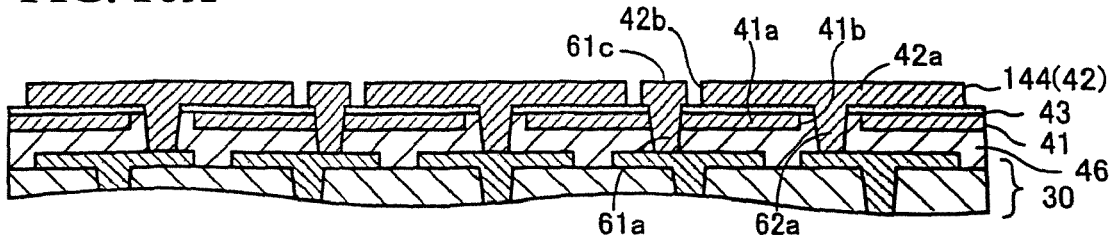
FIGS. 10A-10E are explanatory views of manufacturing processes for a package substrate 10 including no pinhole.
Figure 10A:
Figure 10B:
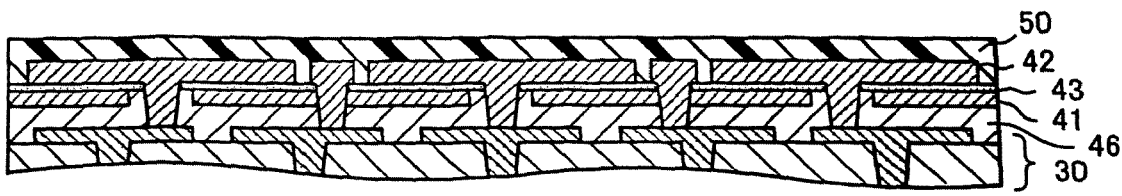

Next, on the substrate in the process of this manufacturing, a stress relaxation layer 50 is laminated in the laminating conditions of a temperature of 50 through 150° C. and a pressure of 0.5 through 1.5 MPa by a vacuum laminator, and cured for three hours at 150° C. (FIG. 10B). This stress relaxation layer 50 is a modified epoxy-based resin sheet, polyphenylene ether-based resin sheet, polyimide-based resin sheet, cyanoester-based resin sheet, or imide-based resin sheet, and it can contain a polyolefin-based resin or polyimide-based resin as a thermoplastic resin, a silicone resin as a thermosetting resin, or a rubber-based resin such as SBR, NBR, or urethane, and fiber-like, filler-like, or flat materials of inorganic materials such as silica, alumina, and zirconia can be dispersed in it. The Young's modulus of this stress relaxation layer 50 is preferably 10 through 1000 MPa. A manufacturing example of such a stress relaxation layer 50 is described below. Namely, a resin composition obtained by dissolving 100 parts by weight of a naphthalene-type epoxy resin (manufactured by NIPPON KAYAKU Co., Ltd., product name: NC-700L), 20 parts by weight of phenol-xylylene glycol condensation resin (manufactured by Mitsui Chemicals Inc., product name: XLC-LL), 90 parts by weight of carboxylate-modified NBR (manufactured by JSR, product name: XER-91) with Tg of −50° C. as cross-linking rubber particles, and 4 parts by weight of 1-cyanoethyl-2-ethyl-4-methylimidazole in 300 parts by weight of ethyl lactate was applied onto a film with a 42 through 45 μm made of polymethyl pentene (TPX) (manufactured by Mitsui Petrochemical, product name: Opulent X-88) by using a roll coater (manufactured by CERMATRONICS BOEKI), and then dried for 2 hours at 80° C., 1 hour at 120° C., and 30 minutes at 150° C. to obtain a stress relaxation sheet with a thickness of 40 μm. The Young's modulus of the stress relaxation layer 50 thus manufactured was 500 MPa at 30° C.

Figure 10C:
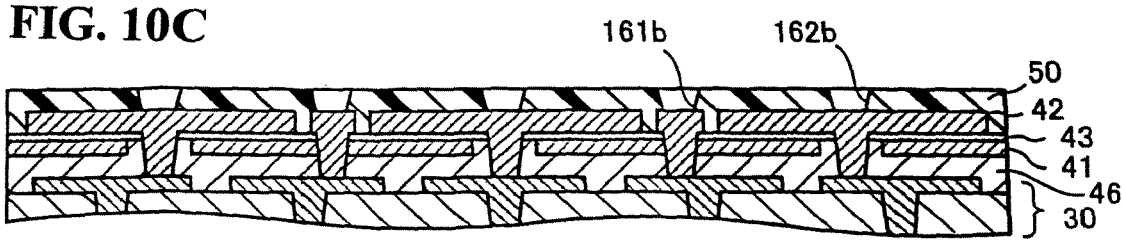
Figure 10C:
Figure 10D:
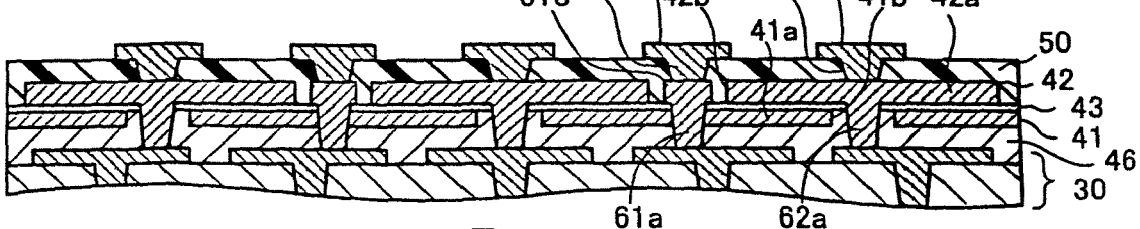
Figure 10D:
Figure 10E:
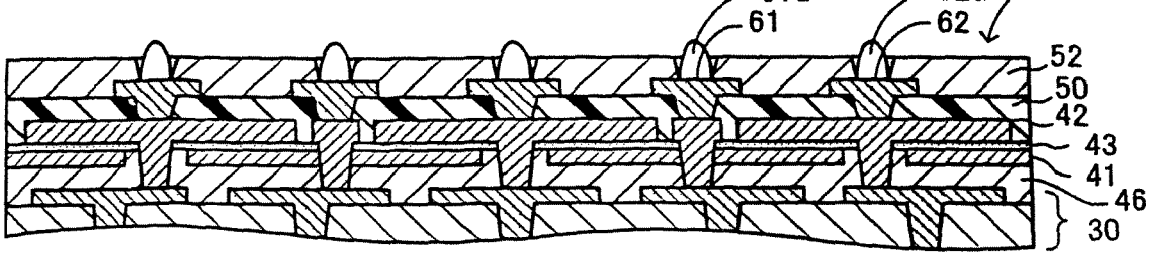

Next, at predetermined positions of the stress relaxation layer 50, blind holes 161b and 162b were formed by one shot of an energy density of 2.0 mj through mask diameters of φ1.4 mm by using a $CO_2$ laser (see FIG. 10C). Subsequently, the surface was roughed, and the stress relaxation layer 50 was completely cured by drying and curing for 3 hours at 150° C. Thereafter, by applying the processes of catalyst supplying, chemical copper, plating resist forming, electrical copper plating, plating resist separation, and quick etching, the blind holes 161b and 162b were filled with copper and via holes 61b and 62b were formed, and on the upper surfaces of the via holes 61b and 62b, power supply pads 61 and ground pads 62 were formed (see FIG. 10D). The signal pads 63, the power supply interconnections 66, the ground interconnections 67, and the pads 71 and 72 shown in FIG. 1 were also formed at the same time although these are not shown. Subsequently, a photosensitive dry film was laminated as a solder resist layer 52 by a vacuum laminator and exposed and developed, whereby forming openings at positions opposite the pads 61 and 62 of the solder resist layer 52, and then ultraviolet ray irradiation and heating were applied to completely cure the solder resist layer 52. Subsequently, solder paste was printed by using an unillustrated metal mask to fill the solder paste in the openings, and then the metal mask was removed and reflow was applied, whereby solder bumps 61d and 62d were formed (see FIG. 10E). Thereby, the package substrate 10 shown in FIG. 2 was completed. In the solder resist layer 52, at positions opposite the signal pads 63, openings as well as solder bumps were formed, and at positions opposite the pads 71 and 72, only openings were formed.

In the inspection for a portion with a pinhole in the high dielectric layer 43, when a current flows only between, for example, the first thin-film small electrode S and the small copper piece T of FIG. 8, an unnecessary conductive portion (hereinafter referred to as a pinhole P) such as a pinhole is generated in the high dielectric layer 43 between the first thin-film small electrode S and the small copper piece T, so that the package substrate 10 is manufactured so as to finally have the sectional structure of FIG. 5. The procedures of manufacturing the package substrate 10 of FIG. 5 are basically the same as those of the package substrate 10 of FIG. 2, therefore, only the procedures different between these are explained below with reference to FIG. 11 and FIG. 12. The steps of FIG. 11A through FIG. 11E correspond to the steps of FIG. 9A through FIG. 9E, and the steps of FIG. 12A through FIG. 12E correspond to the steps of FIG. 10A through FIG. 10E.

Figure 11A:
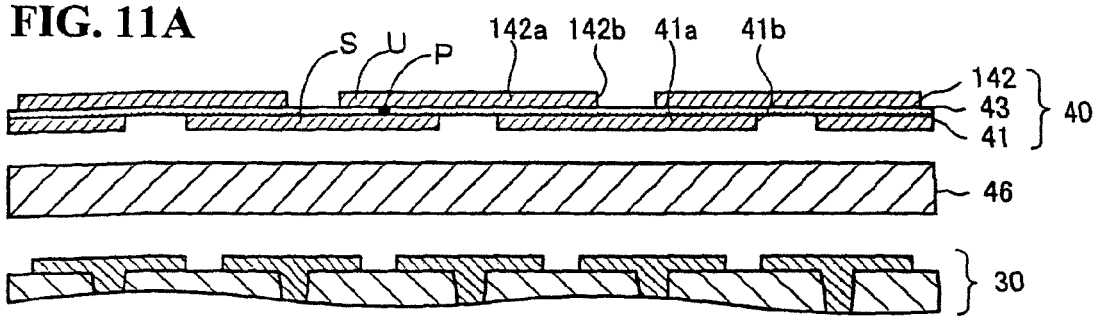
FIGS. 11A-11E are explanatory views of manufacturing processes for a package substrate 10 including a pinhole.
Figure 11B:
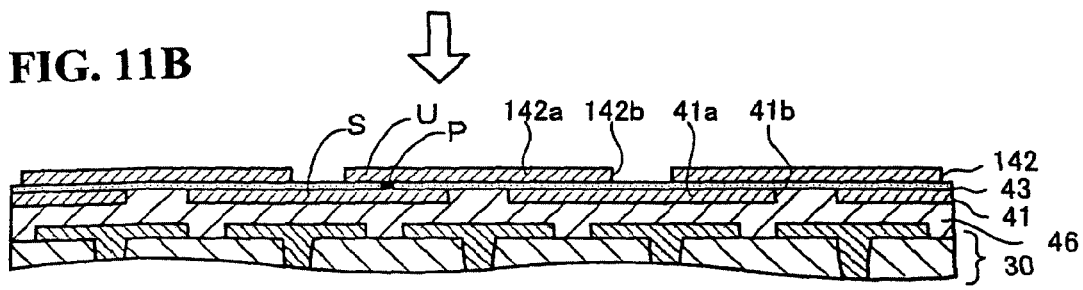
Figure 11C:
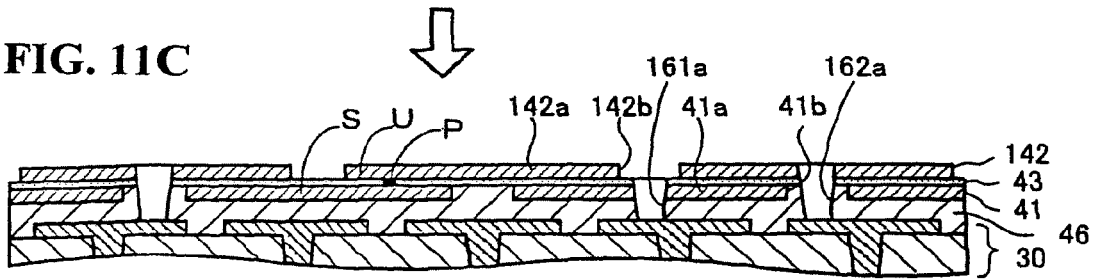
Figure 11D:
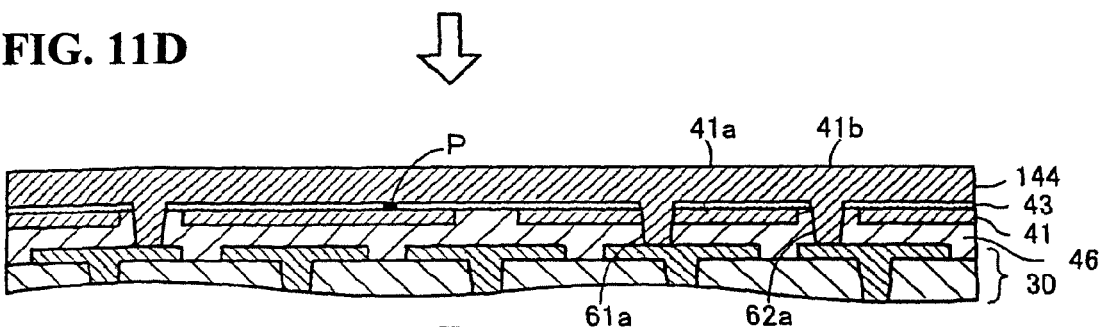
Figure 11E:
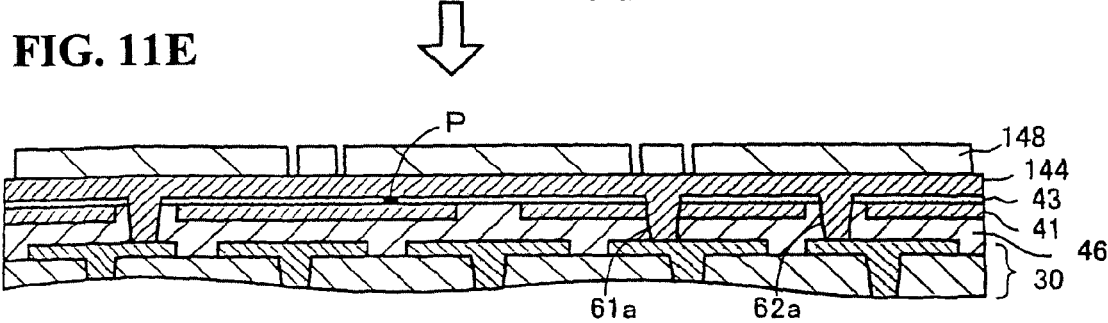

First, the positions of the interlayer dielectric layer 46 and the thin-film capacitor 40 were aligned on the build-up layer 30 by a pin laminating method (see FIG. 11A) and were affixed (see FIG. 11B). Subsequently, at the positions above the centers of the clearance holes 41b and the central positions of the clearance holes 142b, blind holes 161a and 162a were formed (see FIG. 11C). At this time, the blind holes 161a and 162a were not formed in the first thin-film small electrode S and the small copper piece U that were conducted by the pinhole P. Subsequently, the insides of the blind holes 161a and 162a were filled with copper by copper plating to form power supply posts 61a and ground posts 62a, and the entire surface was covered by copper to form a solid-pattern copper layer 144 (see FIG. 11D). Next, the copper layer 144 was thinned and then a resist 148 was printed (see FIG. 11E), and treated with an etching solution to form the second thin-film small electrodes 42a, the clearance holes 42b, and the lands 61c on the upper surface of the high dielectric layer 43 (see FIG. 12A), and the linear grooves 42c (see FIG. 2) were formed between the second thin-film small electrodes 42a (tenting). Hereinafter, the copper layer 144 is referred to as a second thin-film electrode 42. The first thin film small electrode S is referred to as a first thin-film small electrode 41aa, and the second thin-film small electrode 42a at the position of the small copper piece S is referred to as a second thin-film small electrode 42aa. Next, the stress relaxation layer 50 was affixed with a vacuum laminator (see FIG. 12B), and then blind holes 161a and 162b were formed at predetermined positions of the stress relaxation layer 50 (see FIG. 12C). At this time, at the positions above the first thin-film small electrode 41aa and the second thin-film small electrode 42aa, the blind holes 161a and 162b were not formed. Thereafter, the blind holes 161b and 162b were filled with copper to form via holes 61b and 62b, and on the upper surfaces of the via holes 61b and 62b, power supply pads 61 and ground pads 62 were formed (see FIG. 12D). At this time, the power supply pad 61 and the ground pad 62 were also formed above the first thin-film small electrode 41aa and the second thin-film small electrode 42aa respectively. The signal pads 63 and the power supply interconnections 66, the ground interconnections 67, and the pads 71 and 72 shown in FIG. 1 were also simultaneously formed although these are not shown. Subsequently, a solder resist layer 52 was laminated, openings were formed at positions of the solder resist layer 52 opposite the pads 61 and 62, and then solder paste was printed to fill the solder paste inside the openings, and reflow was applied to form solder bumps 61d and 62d (see FIG. 12E). The package substrate 10 shown in FIG. 5 was thus manufactured.

In the package substrate 10 described in detail above, among the plurality of first thin-film small electrodes 41a and the plurality of second thin-film small electrodes 42a forming the thin-film capacitor 40, the first thin-film small electrode 41aa and the second thin-film small electrode 42aa are electrically short-circuited via an unnecessary conductive portion (for example, pinhole P) generated in the high dielectric layer 43, and are wired independently from both the power supply potential and the ground potential. Therefore, other first thin-film small electrodes 41a and second thin-film small electrodes 42a opposite each other and electrically insulated are not short-circuited. As a result, other first thin-film small electrodes 41a and second thin-film small electrodes 42a opposite each other and electrically insulated still adequately perform the capacitor function. Therefore, even when a short-circuit occurs between the electrodes of the thin-film capacitor 40, the thin-film capacitor 40 can maintain the capacitor performance, and the yield of the package substrate 10 with a built-in capacitor can be prevented from deteriorating.

The thin-film capacitor 40 has the high dielectric layer 43 made of ceramic with a high permittivity and a thickness of 10 µm or less, and the first and second thin-film electrodes 41 and 42 are obtained by cutting a so-called solid pattern by linear grooves 41c and 42c and have sufficiently large areas, so that their capacitances can be sufficiently large. As a result, an adequate decoupling effect is obtained even in a situation in that the frequency to turn the semiconductor device 80 on/off becomes as high as several GHz through several tens of GHz, and that an instantaneous potential drop easily occurs. The high dielectric layer 43 is not sintered on the substrate in the process of manufacturing, and a high dielectric material is sintered separately in advance of being incorporated in the substrate in the process of manufacturing. This procedure allows easy incorporation of a high dielectric layer.

The power supply posts 61a and the ground posts 62a are alternately arranged in a lattice pattern or staggered pattern below the semiconductor device 80. This structure makes loop inductance lowered, and thus an instantaneous drop of the power supply potential of the semiconductor device 80 can be easily prevented.

Furthermore, even when a stress is caused by a thermal expansion coefficient difference between the semiconductor device 80 and the package substrate 10, the stress relaxation layer 50 absorbs the stress, so that a defect hardly occurs.

The above embodiment is to be considered in all aspects as illustrative and not restrictive. There may be many modifications, changes, and alterations without departing from the scope or spirit of the main characteristics of the present invention. All changes within the meaning and range of equivalency of the claims are therefore intended to be embraced therein.

Figure 13:
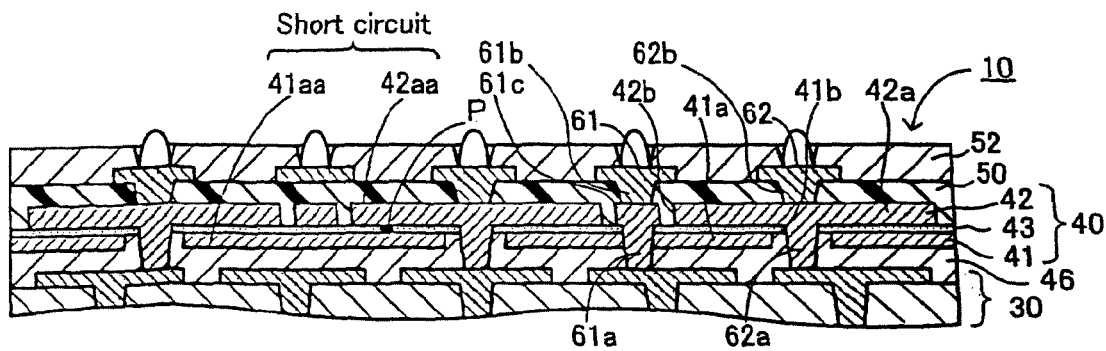
FIG. 13 is a partial sectional view of another package substrate 10 including a pinhole.

In the above-described embodiment, when there exist the first thin-film small electrode 41aa and the second thin-film small electrode 42aa that are electrically short-circuited via the pinhole P of the high dielectric layer 43 as shown in FIG. 5, the power supply post 61a and the via hole 61b are not formed in the first thin-film small electrode 41aa, and the ground post 62a and the via hole 62b are not formed in the second thin-film small electrode 42aa. The structure may be modified as shown in FIG. 13. In the modified structure of FIG. 13, although the power supply post 61a and the via hole 61b are not formed in the first thin-film small electrode 41aa, the ground post 62a and the via hole 62b are formed in the second thin-film small electrode 42aa. In this case, the second thin-film small electrode 42aa becomes the ground potential, and the first thin-film small electrode 41aa short-circuited to the second thin-film small electrode 42aa also becomes the ground potential. However, the first thin-film small electrode 41aa is electrically connected to neither the power supply pad 61 above it nor the build-up layer 30 below it. Therefore, the first thin-film small electrode 41aa becomes a potential independent from the power supply potential, and thus the thin-film capacitor 40 can maintain the capacitor performance in spite of the presence of the pinhole P, preventing the yield of the package substrate 10 from deteriorating.

Figure 14:
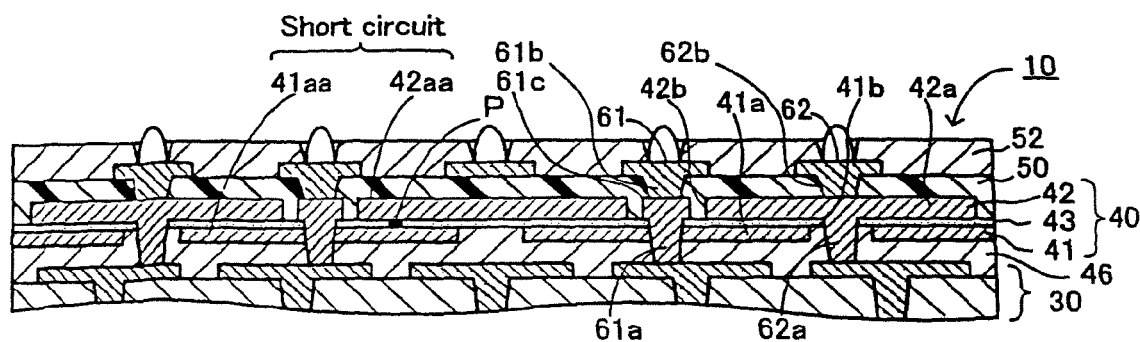
FIG. 14 is a partial sectional view of another package substrate 10 including a pinhole.

The structure of the package substrate 10 of the above embodiment may also be modified as shown in FIG. 14. In the modified structure shown in FIG. 14, the power supply post 61a and the via hole 61b are formed in the first thin-film small electrode 41aa, however, the ground post 62a and the via hole 62b are not formed in the second thin-film small electrode 42aa. In this structure, the first thin-film small electrode 41aa becomes the power supply potential, so that the second thin-film small electrode 42aa short-circuited to the first thin-film small electrode 41aa also becomes the power supply potential, however, the second thin-film small electrode 42aa is electrically connected to neither the ground pad 62 above it nor the build-up layer 30 below it. Therefore, the second thin-film small electrode 42aa becomes a potential becomes independent from the ground potential, and thus the thin-film capacitor 40 can maintain the capacitor performance in spite of the presence of the pinhole P, and the yield of the package substrate with a built-in capacitor can be prevented from deteriorating.

Figure 12A:
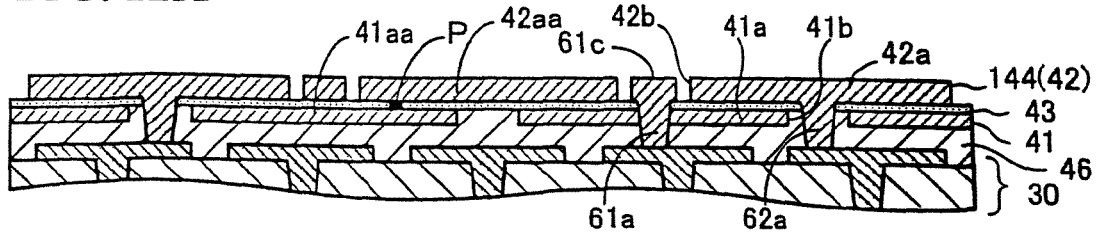
FIGS. 12A-12E are explanatory views of manufacturing processes for a package substrate 10 including a pinhole.
Figure 12B:
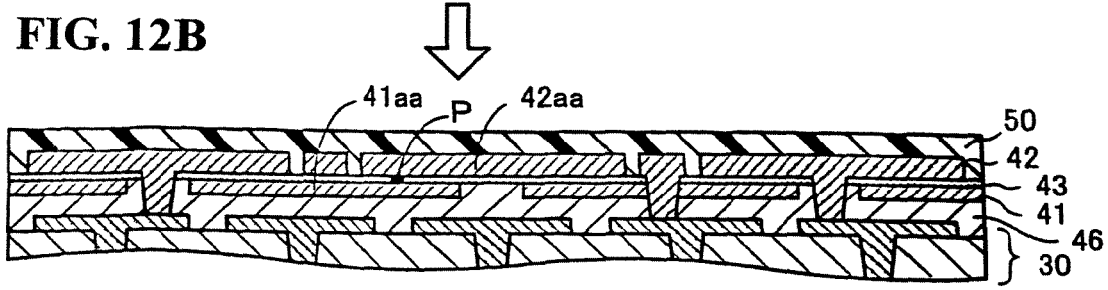
Figure 12C:
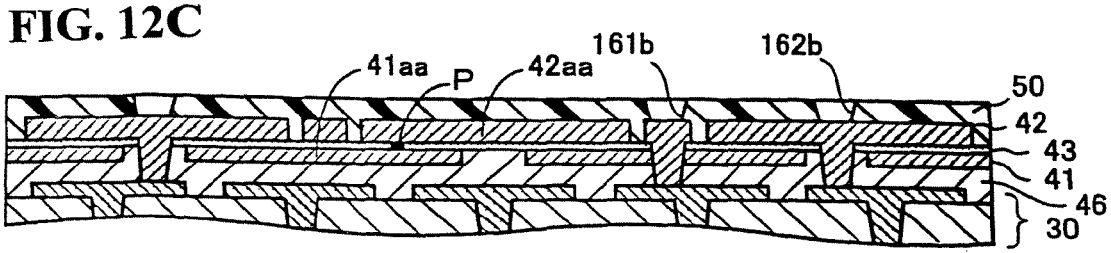
Figure 12D:
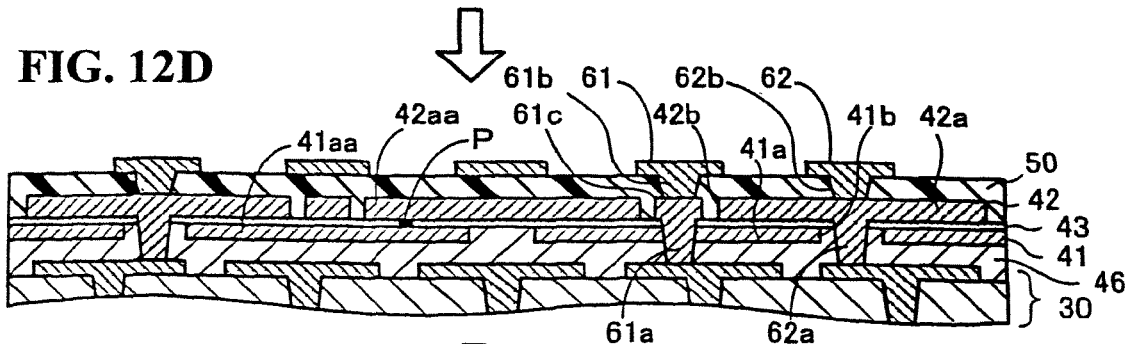
Figure 12E:
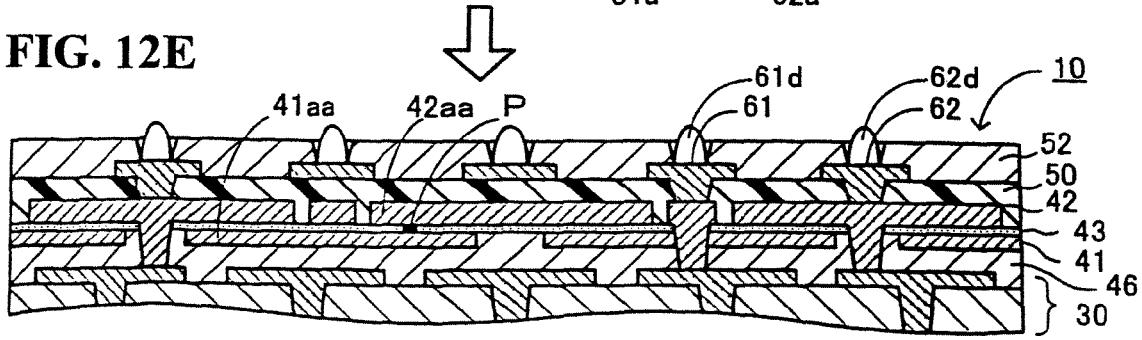

In the structures of FIG. 12D and FIG. 13, the via hole 61b above the first thin-film small electrode 41aa is not formed. However, even if this via hole 61b is formed, the function of the thin-film capacitor 40 is not lost. Therefore, the via hole 61b may be formed.

Figure 15:
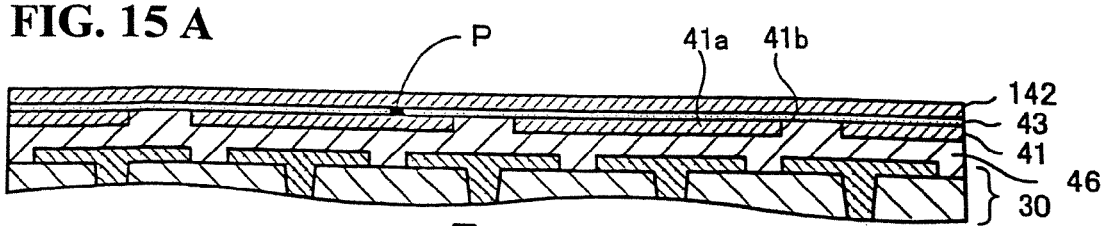
FIGS. 15A-15E are explanatory views of other inspection steps to inspect whether a pinhole has been generated.
Figure 15B:
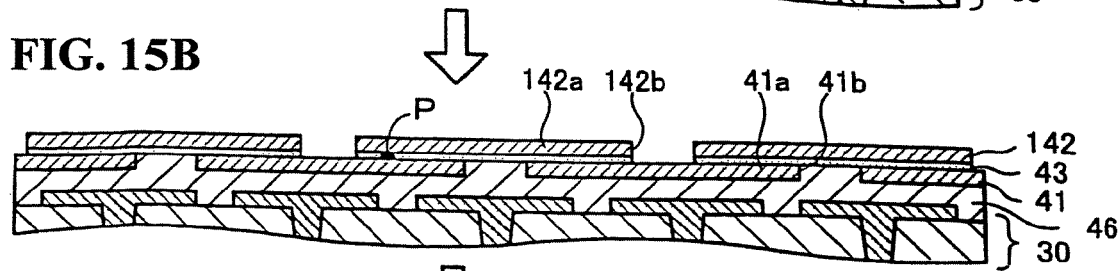
Figure 15C:
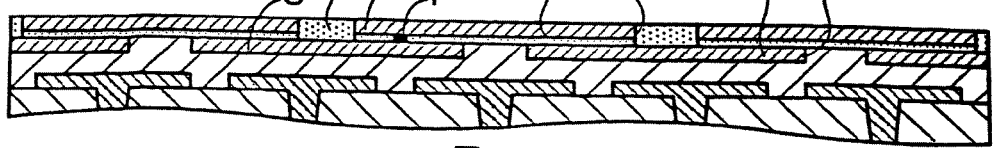
Figure 15D:
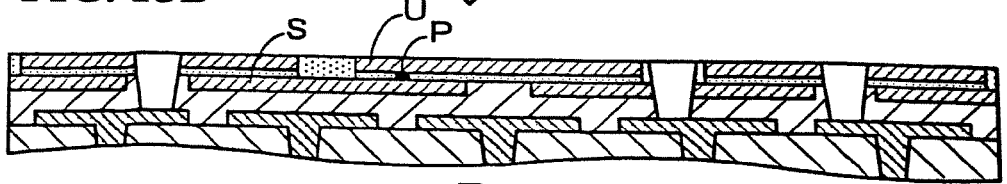
Figure 15E:
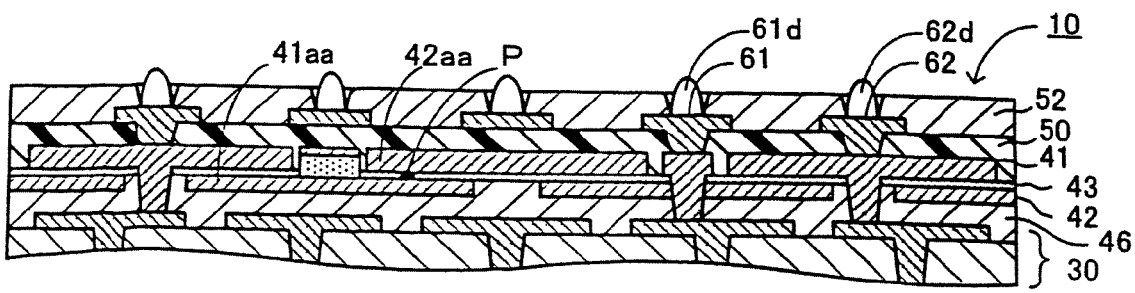

In the above-described embodiment, the inspection as to whether the pinhole P had been made in the high dielectric layer 43 was performed previous to lamination of the thin-film capacitor 40 including the first thin-film small electrodes 41a on one side and small copper pieces 142a on the other side onto the substrate. However, the timing of the inspection is not limited to this. One procedure may form the linear grooves 41c and the clearance holes 41b are formed only in the first thin-film electrode 41, subsequently affix the thin-film capacitor 40 divided into a number of first thin-film small electrodes 41a onto the build-up layer 30 via the interlayer dielectric layer 46 (see FIG. 15A), form the small copper pieces 142a and the clearance holes 142b by etching the copper foil 142 by tenting, then remove the high-dielectric layer 43 inside the clearance holes 142b to expose the first thin-film small electrodes 41a (see FIG. 15B), and at this stage, perform the inspection as to whether a current can flow between the portions of the first thin-film small electrodes 41a exposed from the clearance holes 142b and the small copper pieces 142a overlapping the first thin-film small electrodes 41a. In this case, the procedure subsequently performs the etching of the copper foil 142 by using a copper cupric chloride etching solution as an etching solution in a short period of time so that the copper foil 142 and the high dielectric layer 43 are etched and then the first thin-film electrode 41 is slightly etched. Thereafter, the procedure embeds an insulating resin in the portions of the first thin-film small electrodes 41a exposed to the outside and smoothens surface (see FIG. 15C), and forms blind holes 161a and 162a on the positions above the centers of the clearance holes 41b and the central positions of the clearance holes 142b (see FIG. 15D). Here, when it is assumed that the first thin-film small electrode S and the small copper piece U are conducted to each other by means of the pinhole P, the blind holes 161*a* and 162*a* are not formed in the first thin-film small electrode S and the small copper piece U. Subsequent procedures are the same as those of FIG. 11D through FIG. 11E and FIG. 12A through FIG. 12E, so that description thereof is omitted. As a result, the package substrate 10 shown in FIG. 15E is obtained.

Figure 16A:
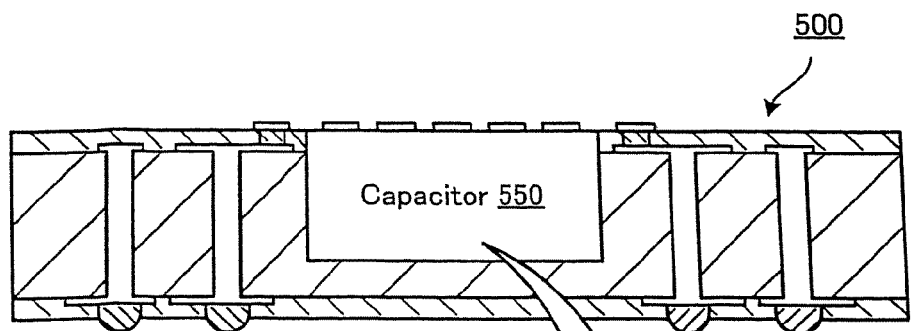
FIGS. 16A-16B are sectional views of the package substrate of the conventional example.
Figure 16B:
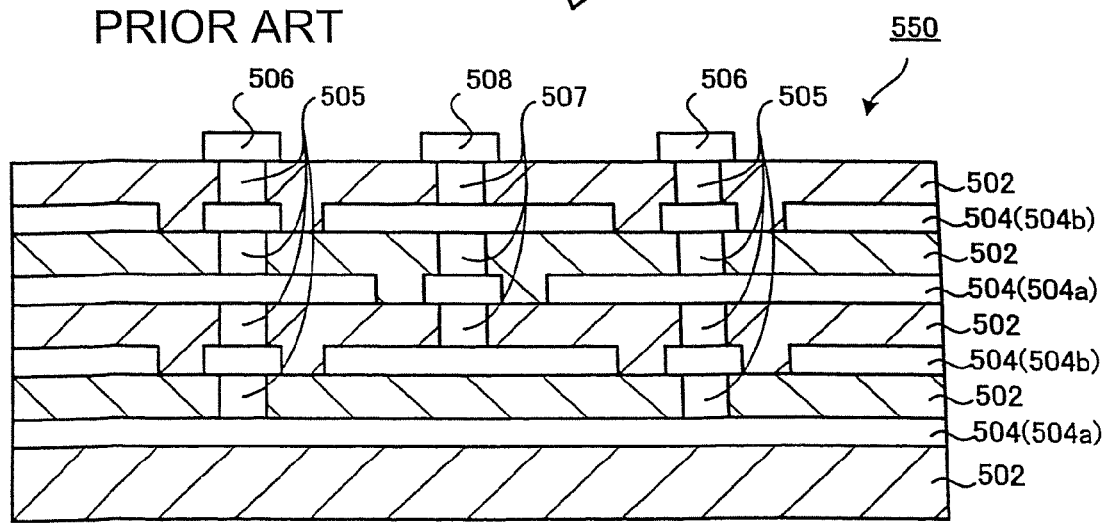

In the above-described embodiment, the thin-film capacitor 40 includes one layer of the first thin-film electrode 41, one layer of the high dielectric layer 43, and one layer of the second thin-film electrode 42. In one modified structure shown in FIG. 16, a capacitor portion 550 includes a plurality of sets of the first thin-film electrode 41, the dielectric layer 43, and the second thin-film electrode 42 that are alternately laminated.

In the above-described embodiment, a chip capacitor is mounted in the chip capacitor providing region 70. However, the chip capacitor providing region 70 may be omitted when sufficient capacitance is obtained only by the thin-film capacitor 40. This allows minimization in size of the package substrate 10.

In the above-described embodiment, the high dielectric layer 43 is made of ceramic. The high dielectric layer 43 may be made of an organic resin containing a ceramic-based high dielectric material as an inorganic filler.

Furthermore, the stress relaxation layer 50 may be provided on the entire surface of the package substrate 10, or may be provided only below the semiconductor device 80 to be mounted. The stress caused by the thermal expansion coefficient difference mainly comes out below the semiconductor device 80, so that the material cost can be reduced by forming the stress relaxation layer 50 at this portion.

Furthermore, in the above-described embodiment, the power supply interconnections 66 and the ground interconnections 67 are formed in the same layer as the power supply pads 61 and the ground pads 62. In one modified structure, the interconnections may be formed in a layer different from the pads 61 and 62, for example, between the pads 61 and 62 and the thin-film capacitor 40, or lower than the thin-film capacitor 40 (formed in the build-up layer 30 or the core substrate 20).

What is claimed is:

1. A package substrate with a built-in capacitor, comprising:
    a plurality of power supply pads;
    a plurality of ground pads provided in the same layer as the power supply pads;
    a thin-film capacitor that includes a high dielectric layer and first and second thin-film electrodes sandwiching the high dielectric layer, where the first thin-film electrode includes a plurality of first thin-film small electrodes and the second thin-film electrode includes a plurality of second thin-film small electrodes;
    an insulating layer that is disposed between the thin-film capacitor and the layer with the plurality of pads; and
    internal wirings which wire some of the first thin-film electrodes that are opposed to and electrically insulated from the second thin-film electrodes to make a wiring having either of a power supply potential or a ground potential, wire some of the second thin-film electrodes that are opposed to and electrically insulated from the first thin-film electrodes to make a wiring having the other potential, and make one of the first thin-film small electrodes and one of the second thin-film small electrodes that are electrically short-circuited to each other via an unnecessary conductive portion generated in the high-dielectric layer become the same potential as the power supply potential and independent from the ground potential.

2. The package substrate with a built-in capacitor according to claim 1, wherein
    the unnecessary conductive portion generated in the high dielectric layer is a pinhole.

3. The package substrate with a built-in capacitor according to claim 1, wherein
    the high dielectric layer is made by sintering a material that contains one, two, or more metal oxides selected from a group consisting of barium titanate ($BaTiO_3$), strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT).

4. The package substrate with a built-in capacitor according to claim 1, wherein
    the distance between the first and second thin-film electrodes in the thin-film capacitor is of 10 µm or less that does not cause substantially short-circuit unless the unnecessary conductive portion is generated in the high dielectric layer.

5. The package substrate with a built-in capacitor according to claim 1, wherein
    the first thin-film electrode is an aggregation of the plurality of first thin-film small electrodes obtained by cutting a solid-pattern metal foil by linear grooves, and has pass-through holes that allow passing of partial wirings of the internal wirings to electrically connect the ground pads and a ground conductor layer formed lower than the thin-film capacitor in a non-contact state, and
    the second thin-film electrode is an aggregation of the plurality of second thin-film small electrodes obtained by cutting a solid-pattern metal foil by linear grooves, and has pass-through holes that allows passing of partial wirings of the internal wirings to electrically connect the power supply pads and a power supply conductor layer formed lower than the thin-film capacitor in a non-contact state.

6. The package substrate with a built-in capacitor according to claim 1, further comprising:
    a stress relaxation portion that is capable of relaxing a stress occurred between the package substrate and a semiconductor device mounted thereon.

7. The package substrate with a built-in capacitor according to claim 6, wherein
    the stress relaxation portion is formed only in a region below a semiconductor device mounted.

* * * * *